United States Patent
Yamashita et al.

(10) Patent No.: US 8,577,513 B2
(45) Date of Patent: Nov. 5, 2013

(54) POWER SYSTEM, POWER RECEIVING APPARATUS, AND POWER TRANSMISSION CONTROL METHOD

(75) Inventors: Kei Yamashita, Kanagawa (JP); Hideki Noma, Kanagawa (JP); Hiroshi Kawashima, Tokyo (JP); Junko Saito, Kanagawa (JP); Ryoki Honjo, Kanagawa (JP); Kayoko Tanaka, Tokyo (JP); Masaya Kimura, Chiba (JP)

(73) Assignee: Sony Corporation, Tokyo (JP)

(*) Notice: Subject to any disclaimer, the term of this patent is extended or adjusted under 35 U.S.C. 154(b) by 334 days.

(21) Appl. No.: 13/155,486

(22) Filed: Jun. 8, 2011

(65) Prior Publication Data
US 2012/0010760 A1    Jan. 12, 2012

(30) Foreign Application Priority Data
Jul. 7, 2010   (JP) ................ P2010-155114

(51) Int. Cl.
| G05D 3/12 | (2006.01) |
| G05D 5/00 | (2006.01) |
| G05D 9/00 | (2006.01) |
| G05D 11/00 | (2006.01) |
| G05D 17/00 | (2006.01) |
| G05B 11/01 | (2006.01) |
| G01R 21/00 | (2006.01) |
| G01R 21/06 | (2006.01) |

(52) U.S. Cl.
USPC ............ 700/297; 700/22; 700/286; 700/291; 700/295; 702/60; 702/61; 323/299

(58) Field of Classification Search
USPC ........... 700/22, 286, 291, 295, 297; 323/299; 702/60–61
See application file for complete search history.

(56) References Cited

U.S. PATENT DOCUMENTS

| 6,891,478 | B2* | 5/2005 | Gardner ................ 340/635 |
| 8,269,622 | B2* | 9/2012 | Chan et al. ............ 340/538 |
| 2003/0220720 | A1 | 11/2003 | Shimode et al. |
| 2008/0122518 | A1* | 5/2008 | Besser et al. ............ 327/518 |
| 2011/0181124 | A1* | 7/2011 | Uesaka ................ 307/113 |
| 2011/0183733 | A1* | 7/2011 | Yoshida et al. ............ 463/1 |
| 2011/0185196 | A1* | 7/2011 | Asano et al. ............ 713/300 |
| 2012/0059532 | A1* | 3/2012 | Reifenhauser et al. ...... 700/297 |
| 2012/0098350 | A1* | 4/2012 | Campanella et al. ...... 307/104 |
| 2012/0191387 | A1* | 7/2012 | Yamanaka et al. ............ 702/62 |

FOREIGN PATENT DOCUMENTS

| JP | 2002-112458 | 4/2002 |
| JP | 2007-89317 | 4/2007 |

* cited by examiner

*Primary Examiner* — Ramesh Patel
(74) *Attorney, Agent, or Firm* — Finnegan Henderson Farabow Garrett & Dunner LLP

(57) ABSTRACT

There is provided a power system including a power transmitting apparatus and a power receiving apparatus. The power transmitting apparatus includes: a power generating unit generating power using renewable energy; a first power measuring unit measuring a power amount generated in a specified period; and a power transmitting unit transmitting the generated power in the specified period and information on the measured power amount to the power receiving apparatus. The power receiving apparatus includes: a power receiving unit receiving the power and the information on the power amount from the power transmitting apparatus; a second power measuring unit measuring a power amount received in the specified period; a determining unit comparing the received power amount and the measured power amount and determining whether such amounts match; and a power reception control unit operable when the amounts do not match, to stop reception of the power and the information.

9 Claims, 9 Drawing Sheets

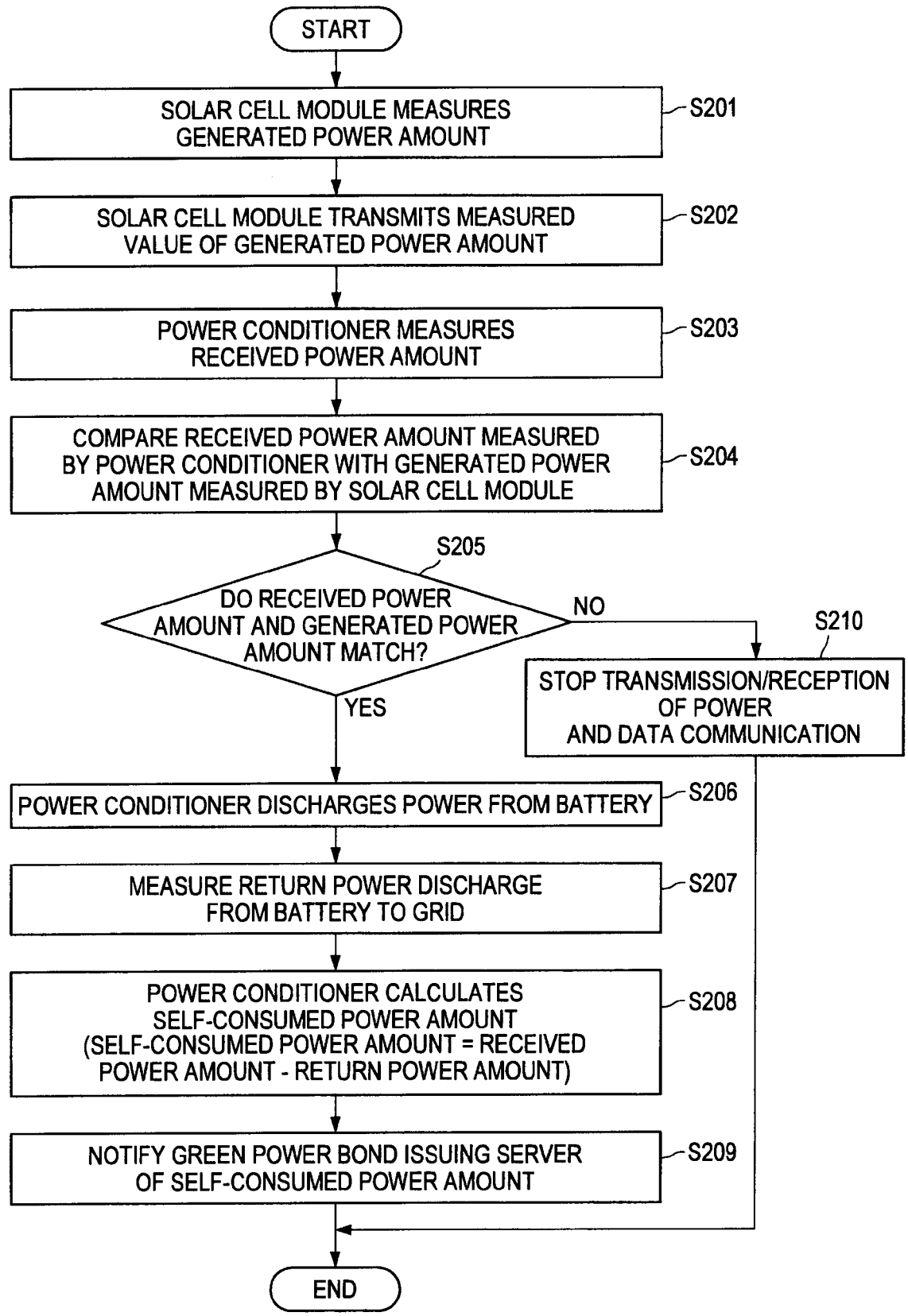

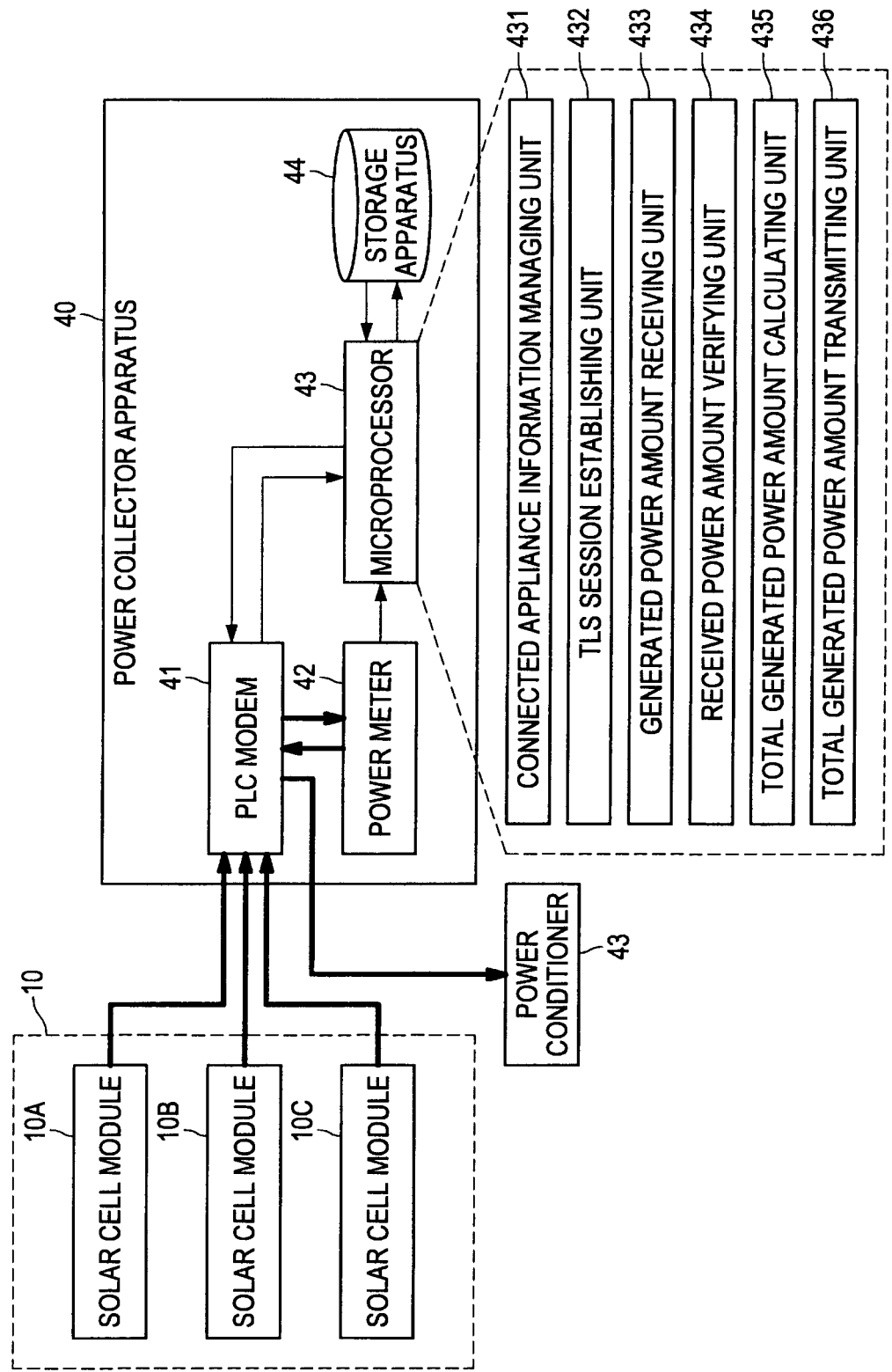

POWER SYSTEM, POWER RECEIVING APPARATUS, AND POWER TRANSMISSION CONTROL METHOD

BACKGROUND

The present disclosure relates to a power system, a power receiving apparatus, and a power transmission control method.

The global environmental problem has become more serious in recent years, and various countries have commenced a number of environmental measures. In this state, attention is being focused on power generation methods that use renewable energy, such as solar, wind, and geothermal power, and power generation methods that use resources with a low environmental impact, such as biomass-powered generation and fuel cells. At present, electricity is mainly generated by thermal power generation using fossil fuel such as oil and coal, nuclear power generation using nuclear fuel, and hydroelectric power generation using water flow.

Nuclear power generation and hydroelectric power generation generate electricity with a low environmental impact. However, with nuclear power generation, there is the accompanying risk and difficulty of safely managing nuclear fuel. Use of hydroelectric power generation meanwhile is limited to regions with the appropriate geographical conditions that enable dam construction and the like. Thermal power generation also has many problems such as the depletion of fossil fuels and the emission of $CO_2$ and $NO_x$ that are produced when fossil fuel is burnt.

In response to such problems, research is advancing into methods of replacing much of the electricity traditionally provided by nuclear power, hydroelectric power, thermal power generation, and the like with electricity produced from renewable energy or resources with a lower environmental impact.

Also, in recent years, individual consumers themselves have become increasingly aware of the global environmental problem and have begun to install power generating apparatuses (hereinafter, green power generating apparatuses) that use renewable energy or resources with little environmental impact in their homes. Also, to overcome the instability of supply that is the weakness of power generation methods based on renewable energy, there are also moves toward installing power storing apparatuses along with green power generating apparatuses. It is hoped that in the near future, individual power consumers will generate power in their own homes and consume such generated power themselves.

However, methods that use renewable energy or resources with little environmental impact have a comparatively high power generation cost compared to thermal power generation and the like in typical use today. Accordingly, green power generating apparatuses have yet to become sufficiently widespread in spite of the growing environmental concern and subsidies from governments and the like. For this reason, moves are being made towards providing monetary value (hereinafter referred to as "additional environmental value"), which acts as compensation for the user paying extra to protect the environment, to power (hereinafter, green power) generated by a green power generating apparatus.

That is, securitization of the additional environmental value is being investigated. For example, an arrangement where a suitable number of tradable bonds (hereinafter "green power bonds") are issued in accordance with the generated amount of green power has been proposed (see for example, Japanese Laid-Open Patent Publication No. 2007-89317). However, various problems exist for the realization of such an arrangement for issuing green power bonds. One of such problems is that there is no framework for certifying the "greenness" (i.e., the environmental impact) of the resources used to generate power. On the other hand, Japanese Laid-Open Patent Publication No. 2002-112458 discloses the configuration of a power supplying system equipped with a means for calculating the greenness of green power.

SUMMARY

Also, if an arrangement for issuing green power bonds is to be realized, an arrangement that prevents green power bonds from being illegally issued will also be required. As described above, green power bonds assign an additional environmental value to green power, which has a high generation cost compared to electricity (hereinafter, "non-green power") produced by thermal power generation, that makes up for such difference in cost. For this reason, there is concern that users will illegally attempt to receive green power bonds by passing off non-green power that has a low generation cost as green power. One conceivable example of illegal activity would be to tamper with a green power generating apparatus, supply non-green power from outside to a power line connected to green power, and overstate the generated amount of green power.

For this reason, the present disclosure aims to provide a novel and improved power system, power receiving apparatus, and power transmission control method that are capable of preventing the illegal overstating of green power described above.

According to an embodiment of the present disclosure, there is provided a power system which includes a power transmitting apparatus and a power receiving apparatus. The power transmitting apparatus includes a power generating unit generating power using renewable energy; a first power measuring unit measuring a power amount of power generated by the power generating unit in a specified period; and a power transmitting unit transmitting the power generated by the power generating unit in the specified period and information on the power amount measured by the first power measuring unit to the power receiving apparatus. The power receiving apparatus includes a power receiving unit receiving the power transmitted from the power transmitting apparatus and receiving the information on the power amount transmitted from the power transmitting apparatus; a second power measuring unit measuring a power amount of the power received by the power receiving unit in the specified period; a determining unit comparing the information on the power amount received by the power receiving unit and information on the power amount measured by the second power measuring unit and determining whether the two power amounts match; and a power reception control unit operable when the determining unit has determined that the two power amounts do not match, to stop the power receiving unit from receiving the power and from receiving the information.

The power transmitting apparatus may further include an appliance information acquiring unit acquiring appliance information including connected appliance information from the power receiving apparatus; a validity confirming unit confirming the validity of the appliance information acquired by the appliance information acquiring unit; a certificate exchanging unit operable when the validity has been confirmed by the validity confirming unit, to exchange certificates with the power receiving apparatus shown by the connected appliance information included in the appliance information; and a session establishing unit establishing an encrypted communication path for communication with the power receiving apparatus using the certificates exchanged by the certificate exchanging unit. The power transmitting unit may be operable when an encrypted communication path has been established with the power receiving apparatus by the session establishing unit, to transmit the information on the power amount measured by the first power measuring unit to the power receiving apparatus via the encrypted communication path.

The power transmitting unit may be operable when validity of the appliance information was not confirmed by the validity confirming unit or when the encrypted communication path has not been established by the session establishing unit, to transmit neither the power generated by the power generating unit nor the information on the power amount measured by the first power measuring unit to the power receiving apparatus.

The power receiving apparatus may further include a power storing unit storing power received by the power receiving unit; a third power measuring unit measuring a power amount of power discharged from the power storing unit; and an external communication unit transmitting information on the power amount measured by the third power measuring unit to an issuing apparatus for securities granted in keeping with a power amount of power generated from renewable energy.

The power transmitting apparatus may include a plurality of power generating modules that include the power generating unit and the first power measuring unit; and a power amount totaling unit calculating a total power amount by totaling, for each power generating module out of the plurality of power generating modules, the power amount measured by the first power measuring unit included in the power generating module, and the power transmitting unit transmits the power generated by the power generating unit included in each power generating module and information on the total power amount calculated by the power amount totaling unit to the power receiving apparatus.

The power transmission apparatus may further include an appliance information acquiring unit acquiring appliance information including connected appliance information from the power receiving apparatus; a validity confirming unit confirming the validity of the appliance information acquired by the appliance information acquiring unit; a session establishing unit operable when validity has been confirmed by the validity confirming unit, to establish an encrypted communication path for communication with the power receiving apparatus according to an authentication method that uses a shared key. The power transmitting unit may be operable when an encrypted communication path has been established with the power receiving apparatus by the session establishing unit, to transmit the information on the power amount measured by the first power measuring unit to the power receiving apparatus via the encrypted communication path.

According to another embodiment of the present disclosure, there is provided a power receiving apparatus which includes a power receiving unit receiving power transmitted from a power transmitting unit of a power transmitting apparatus and receiving information on a power amount transmitted from the power transmitting unit, the power transmitting apparatus including a power generating unit generating the power using renewable energy, a first power measuring unit measuring the power amount of the power generated by the power generating unit in a specified period, and the power transmitting unit transmitting the power generated by the power generating unit in the specified period and the information on the power amount measured by the first power measuring unit to the power receiving apparatus; a second power measuring unit measuring a power amount of the power received by the power receiving unit in the specified period; a determining unit comparing the information on the power amount received by the power receiving unit and information on the power amount measured by the second power measuring unit and determining whether the two power amounts match; and a power reception control unit operable when the determining unit has determined that the two power amounts do not match, to stop the power receiving unit from receiving the power and from receiving the information.

According to another embodiment of the present disclosure, there is provided a power transmission control method which includes generating, by a power transmitting apparatus, power using renewable energy; measuring, by the power transmitting apparatus, a power amount of the power generated in a specified period; transmitting, by the power transmitting apparatus, the power generated in the specified period and information on the power amount measured by the power transmitting apparatus to a power receiving apparatus; receiving, by the power receiving apparatus, the transmitted power and receiving the transmitted information on the power amount; measuring, by the power receiving apparatus, a power amount of the power received in the specified period; comparing, by the power receiving apparatus, the information on the power amount received by the power receiving apparatus and information on the power amount measured by the power receiving apparatus and determining whether the two power amounts match; and stopping, by the power receiving apparatus when it has been determined that the two power amounts do not match, reception of the power and reception of the information.

According to another embodiment of the present disclosure, there is provided a power transmission control method which includes receiving power transmitted from a power transmitting unit of a power transmitting apparatus and receiving information on a power amount transmitted from the power transmitting unit, the power transmitting apparatus including a power generating unit generating the power using renewable energy, a first power measuring unit measuring the power amount of the power generated by the power generating unit in a specified period, and the power transmitting unit transmitting the power generated by the power generating unit in the specified period and the information on the power amount measured by the first power measuring unit to a power receiving apparatus; measuring, by the power receiving apparatus, a power amount of the power received in the specified period; comparing the information on the received power amount and information on the power amount measured by the power receiving apparatus, and determining whether the two power amounts match; and stopping, when it has been determined that the two power amounts do not match, reception of the power and reception of the information from the power transmitting apparatus.

According to another embodiment of the present disclosure, there is provided a program for causing a computer to realize functions of the power system. According to another embodiment of the present disclosure, there is provided a computer-readable recording medium in which the program is recorded.

According to the embodiments of the present disclosure described above, it is possible to prevent the illegal overstating of green power.

BRIEF DESCRIPTION OF THE DRAWINGS

FIG. 8 is a diagram useful in explaining the flow of processing implemented by the solar cell module and the power conditioner after establishment of a TLS session in the power system according to the same embodiment; and FIG. 9 is a diagram useful in explaining the system configuration of the power system according to a third embodiment of the present disclosure and the functional configuration of a power collector apparatus according to the same embodiment.

DETAILED DESCRIPTION OF THE EMBODIMENT(S)

Figure 1:
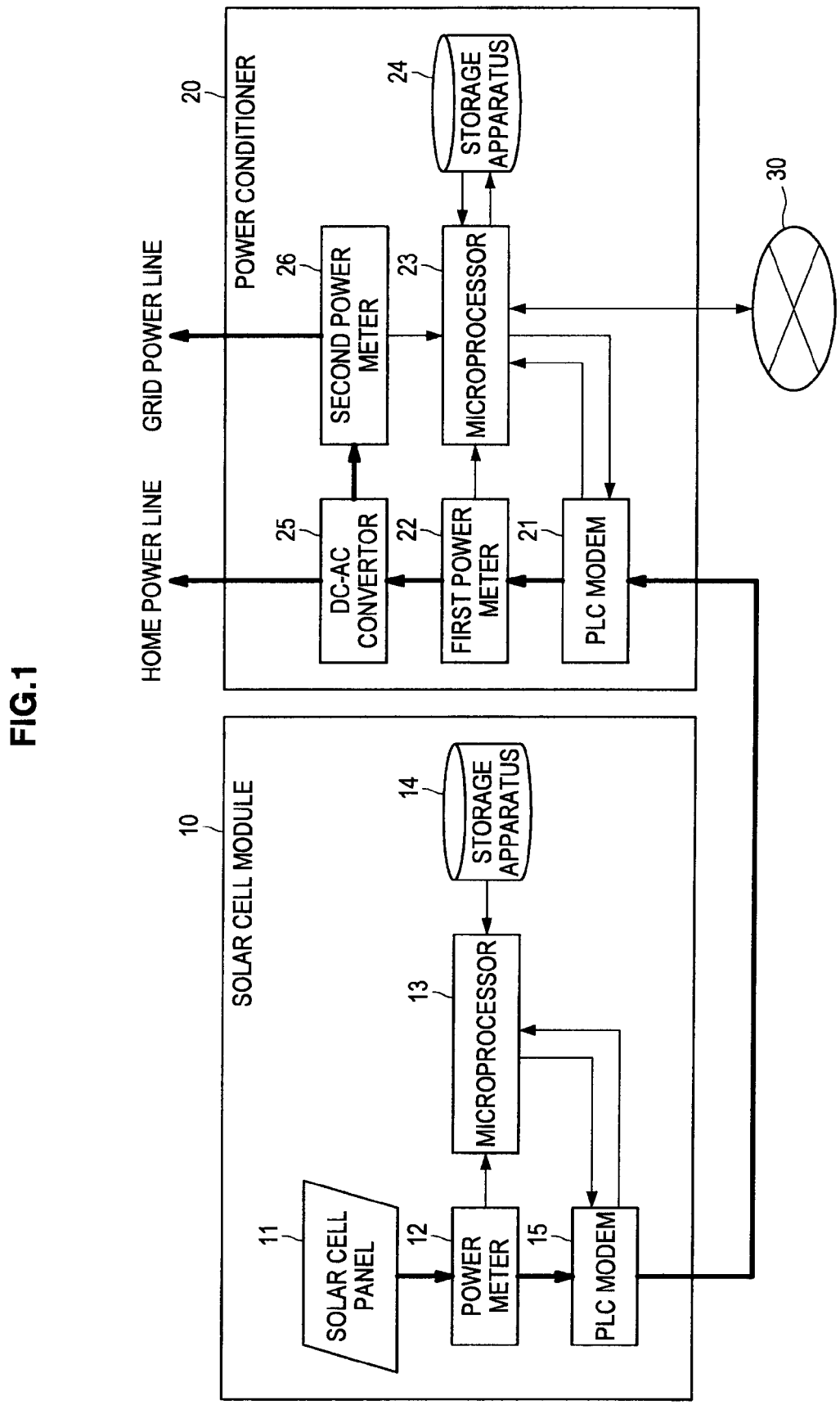
FIG. 1 is a diagram useful in explaining the system configuration of a power system according to a first embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Flow of the Description

Here, the flow of the following description of the embodiments of the present disclosure will be described in brief.

First, the system configuration of a power system according to a first embodiment of the present disclosure will be described with reference to FIG. 1. Next, the functional configuration of a microprocessor 13 provided in a solar cell module 10 according to the same embodiment will be described with reference to FIG. 2. After that, the functional configuration of a microprocessor 23 provided in a power conditioner 20 according to the same embodiment will be described with reference to FIG. 3. The processing flow carried out by the solar cell module and the power conditioner in the power system according to the same embodiment until establishment of a TLS session will then be described with reference to FIG. 4. After that, the processing flow carried out by the solar cell module and the power conditioner in the power system according to the same embodiment after establishment of a TLS session will be described with reference to FIG. 5.

Next, the system configuration of a power system according to a second embodiment of the present disclosure will be described with reference to FIG. 6. After that, the functional configuration of a microprocessor 23 provided in a power conditioner 20 according to the same embodiment will be described with reference to FIG. 7. The processing flow carried out by a solar cell module and the power conditioner in the power system according to the same embodiment after establishment of a TLS session will then be described with reference to FIG. 8. After that, the system configuration of a power system according to a third embodiment of the present disclosure and the functional configuration of a power collector apparatus according to the same embodiment will be described with reference to FIG. 9. Finally, the technical concept according to the first to third embodiments of the present disclosure will be summarized and the operational effect obtained from such technical concept will be described.

Contents

1: First Embodiment
    1-1: System Configuration
        1-1-1: Functional Configuration of Microprocessor 13
        1-1-2: Functional Configuration of Microprocessor 23
    1-2: Processing Flow Until Establishment of TLS Session
    1-3: Processing Flow After Establishment of TLS Session 2: Second Embodiment
    2-1: System Configuration
        2-1-1: Functional Configuration of Microprocessor 23
    2-2: Processing Flow After Establishment of TLS Session 3: Third Embodiment
    3-1: System Configuration 4: Conclusion

1: FIRST EMBODIMENT

A first embodiment of the present disclosure will now be described. The present embodiment relates to a power system capable of preventing illegal tampering with a generated amount of green power.

1-1: System Configuration

First, the system configuration of a power system according to the present embodiment will be described with reference to FIG. 1. FIG. 1 is a diagram useful in explaining the system configuration of the power system according to the present embodiment. Note that the system configuration of the power system illustrated in FIG. 1 is merely one example and the technology according to the present embodiment can be applied to an arbitrary system configuration where green power is generated and the generated amount of green power is notified to an issuing server for green power bonds. However, the technology according to the present embodiment is described below based on the system configuration illustrated in FIG. 1.

As shown in FIG. 1, the power system according to the present embodiment mainly includes a solar cell module 10 and a power conditioner 20. The solar cell module 10 and the power conditioner 20 include tamper-proof hardware. That is, if a user tampers with the solar cell module 10 or the power conditioner 20, such solar cell module 10 or power conditioner 20 will become unusable.

The solar cell module 10 includes a solar cell panel 11, a power meter 12, a microprocessor 13, a storage apparatus 14, and a PLC modem 15. The power conditioner 20 includes a PLC modem 21, a first power meter 22, a microprocessor 23, a storage apparatus 24, a DC-AC convertor 25, and a second power meter 26. Note that "PLC" given above is an abbreviation for "Power Line Communication".

First, the solar cell module 10 generates green power according to a solar power generation method. When light is incident on the solar cell panel 11, electrical power is outputted from the solar cell panel 11 and inputted into the power meter 12. When power is inputted from the solar cell panel 11, the power meter 12 measures the power (hereinafter, "generated power amount") inputted from the solar cell panel 11 in a specified period. The power meter 12 then inputs information on the measured generated power amount into the microprocessor 13. The power inputted into the power meter 12 is inputted into the PLC modem 15. When information on the generated power amount has been inputted, the microprocessor 13 transmits the information on the generated power amount via the PLC modem 15 to the power conditioner 20.

At this time, the microprocessor 13 establishes a TLS session with the microprocessor 23 included in the power conditioner 20 and transmits the information on the generated power amount via an encrypted communication line. Note that the flow of the processing executed by the microprocessors 13, 23 until a TLS session has been established is described in detail later in this specification. It is also assumed that the certificates and the like used to establish a TLS session are stored in the storage apparatus 14 included in the solar cell module 10 and the storage apparatus 24 included in the power conditioner 20. Note that "TLS" given above is an abbreviation for "Transport Layer Security (IETF RFC 5246)".

As mentioned above, the PLC modem 15 receives an input of power (i.e., a DC current) from the power meter 12 and an input of the information on the generated power amount from the microprocessor 13. The PLC modem 15 superimposes the information on the generated power amount onto the power and transmits the power and the information on the generated power amount via a power line to the PLC modem 21 included in the power conditioner 20. At this time, the PLC modem 15 modulates the information on the generated power amount to generate a signal that does not have a DC component and transmits such signal superimposed on the power. Meanwhile, the PLC modem 21 included in the power conditioner 20 separates the power and the information on the generated power amount, inputs the power into the first power meter 22, and inputs the information on the generated power amount into the microprocessor 23.

When power is inputted from the PLC modem 21, the first power meter 22 measures the amount (hereinafter "received power amount") of power that is inputted. The first power meter 22 then inputs information on the received power amount into the microprocessor 23. When information on the generated power amount and information on the received power amount have been inputted, the microprocessor 23 compares the generated power amount and the received power amount based on the inputted information. When the generated power amount and the received power amount match, the microprocessor 23 allows the PLC modem 21 to continue receiving the power and receiving the information on the generated power amount. Meanwhile, when the generated power amount and the received power amount do not match, the microprocessor 23 stops the PLC modem 21 receiving the power and receiving the information on the generated power amount.

In this way, by confirming whether the generated power amount and the received power amount match, it is possible to immediately detect the presence of power inputted from outside onto the power line that connects the solar cell module 10 and the power conditioner 20. Also, as described above, by immediately stopping the receiving of power by the PLC modem 21 when the generated power amount and the received power amount do not match, it is possible to immediately prevent green power bonds from being issued based on illegally supplied power. Note that since a loss of power occurs in reality on power lines and the like, the generated power amount and the received power amount will not precisely match. Accordingly, it should be noted that the microprocessor 23 determines whether the generated power amount and the received power amount match within the range of an error that takes into consideration losses that occur on power lines and the like.

The power inputted from the PLC modem 21 into the first power meter 22 is then inputted into the DC-AC convertor 25. When power is inputted from the first power meter 22, the DC-AC convertor 25 converts the inputted DC power to AC. The DC-AC convertor 25 then applies some of the power converted to AC to power lines installed in the home and inputs the remaining power into the second power meter 26. The second power meter 26 measures the amount (hereinafter "return power amount") of the inputted power and inputs information on the return power amount into the microprocessor 23. The power inputted from the DC-AC convertor 25 into the second power meter 26 is returned via a grid power line to a power grid.

When the information on the return power amount has been inputted, the microprocessor 23 subtracts the return power amount from the received power amount to calculate an amount (hereinafter "self-consumed power amount") of power that has been applied to the power lines installed in the home. The microprocessor 23 then provides, via a network 30, an issuing server for green power bonds with information on the self-consumed power amount. Note that an arrangement where green power bonds are issued for green power consumed in the home is described here. However, in the case of an arrangement where green power bonds are issued for the received power amount that includes the return power amount, information on the received power amount is transmitted from the microprocessor 23 to the issuing server for green power bonds.

As described earlier, the received power amount is a power amount calculated by subtracting losses that occur due to power lines and the like from the generated power amount. In the same way, the self-consumed power amount calculated from the received power amount is a power amount calculated by subtracting losses that occur due to power lines and the like.

The green power bonds should preferably be issued for an amount of power that has been generated by a green power generating apparatus and can actually be used. That is, it is preferable to recognize the additional environmental value of an amount of power that can be used in place of electrical power generated by thermal power generation or the like and to issue green power bonds, which have a monetary value, for such additional environmental value. Based on this viewpoint, the microprocessor 23 according to the present embodiment is configured to inform the issuing server for green power bonds of the self-consumed power amount (or received power amount).

This completes the description of the system configuration of the power system according to the present embodiment. However, detailed description of the processing until the establishment of a TLS session has been omitted. For this reason, after a brief description of the functional configurations of the respective microprocessors 13, 23, the processing flow until a TLS session is established will be described in detail.

1-1-1: Functional Configuration of Microprocessor 13

Figure 2:
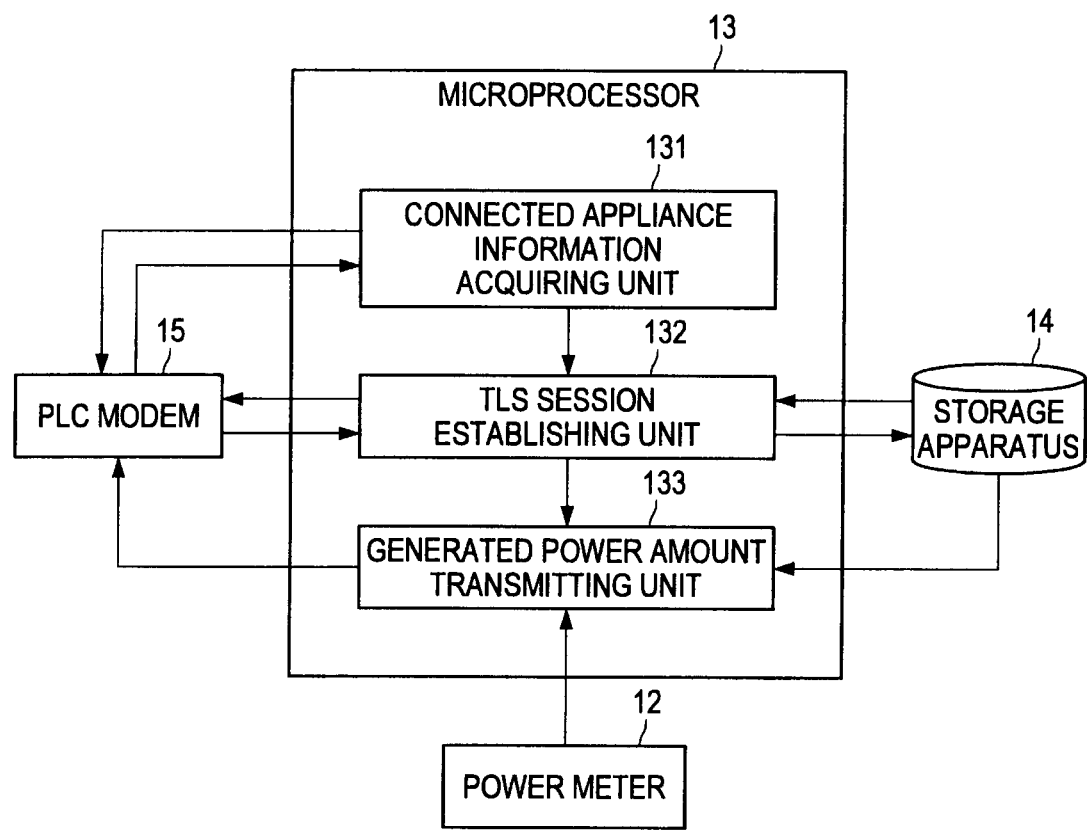
FIG. 2 is a diagram useful in explaining the functional configuration of a microprocessor included in a solar cell module according to the same embodiment.

First, the functional configuration of the microprocessor 13 included in the solar cell module 10 will be described with reference to FIG. 2. FIG. 2 is a diagram useful in explaining the functional configuration of the microprocessor 13 included in the solar cell module 10.

As shown in FIG. 2, the microprocessor 13 includes a connected appliance information acquiring unit 131, a TLS session establishing unit 132, and a generated power amount transmitting unit 133. Note that it is assumed that a program in which TCP/IP protocol is implemented has been installed in the microprocessor 13. It is also assumed that the microprocessor 13 is capable of communication with the microprocessor 23 included in the power conditioner 20 in accordance with TCP/IP protocol.

The connected appliance information acquiring unit 131 discovers a partner appliance that transmits information on a generated power amount and acquires information (hereinafter, "connected appliance information") for connecting to such appliance. When doing so, the connected appliance information acquiring unit 131 discovers connected appliances using SSDP. Here, "SSDP" is an abbreviation for "Simple Service Discovery Protocol" and is a protocol for discovering UPnP devices. When the solar cell module 10 starts up, the connected appliance information acquiring unit 131 acquires connected appliance information via the PLC modem 15 from the microprocessor 23 included in the power conditioner 20.

The connected appliance information acquiring unit 131 that has acquired the connected appliance information confirms the validity of the acquired connected appliance information. When the connected appliance information is valid, the connected appliance information acquiring unit 131 inputs the acquired connected appliance information into the TLS session establishing unit 132. Meanwhile when the acquired connected appliance information is not valid, the connected appliance information acquiring unit 131 ends communication via the PLC modem 15. Note that the connected appliance information includes, as information relating to the connected appliance, information on the appliance type and the like. For this reason, if, on referring to the acquired connected appliance information, a connected appliance is determined to be not the power conditioner 20 but an appliance such as a video appliance or a communication appliance (i.e., to not be a valid connected appliance), the connected appliance information acquiring unit 131 ends the communication with such appliance.

If the validity of the connected appliance information has been confirmed and the connected appliance information has been inputted, the TLS session establishing unit 132 refers to a URL of the power conditioner 20 included in the connected appliance information and attempts to establish a TLS session for such URL. Note that "URL" is an abbreviation for "Uniform Resource Locator". First, the TLS session establishing unit 132 reads the certificate of the solar cell module 10 from the storage apparatus 14 and transmits the certificate via the PLC modem 15 to the microprocessor 23 included in the power conditioner 20. The TLS session establishing unit 132 also receives the certificate of the power conditioner 20 from the microprocessor 23.

Next, the TLS session establishing unit 132 reads a root certificate from the storage apparatus 14 and confirms the validity of the certificate received from the microprocessor 23 included in the power conditioner 20. If the validity of the certificate has been confirmed, the TLS session establishing unit 132 generates a session key. In addition, the TLS session establishing unit 132 encrypts the session key using a public key included in the certificate of the power conditioner 20. The TLS session establishing unit 132 then transmits the encrypted session key to the microprocessor 23 included in the power conditioner 20. At this stage, session keys are shared between the microprocessors 13, 23 and a TLS session is established.

Meanwhile, when it has not been possible to confirm the validity of the certificate of the power conditioner 20, the TLS session establishing unit 132 ends the communication with the power conditioner 20. Note that the microprocessor 13 carries out control so that until a TLS session has been established and it is possible to safely transmit the information on the generated power amount to the power conditioner 20, power is not transmitted to the power conditioner 20. For this reason, so long as at least the validity of the connected appliance information and the validity of the certificate of the power conditioner 20 have not been confirmed, no power will be supplied from the solar cell module 10 to the power conditioner 20.

Once a TLS session has been established, the TLS session establishing unit 132 stores the session key in the storage apparatus 14. The TLS session establishing unit 132 also controls the PLC modem 15 to start the transmission of power to the power conditioner 20. In addition, the TLS session establishing unit 132 notifies the generated power amount transmitting unit 133 of the establishment of the TLS session. On being notified of the establishment of the TLS session, the generated power amount transmitting unit 133 transmits the information on the generated power amount measured by the power meter 12 via the PLC modem 15 to the power conditioner 20.

This completes the description of the functional configuration of the microprocessor 13.

1-1-2: Functional Configuration of Microprocessor 23

Figure 3:
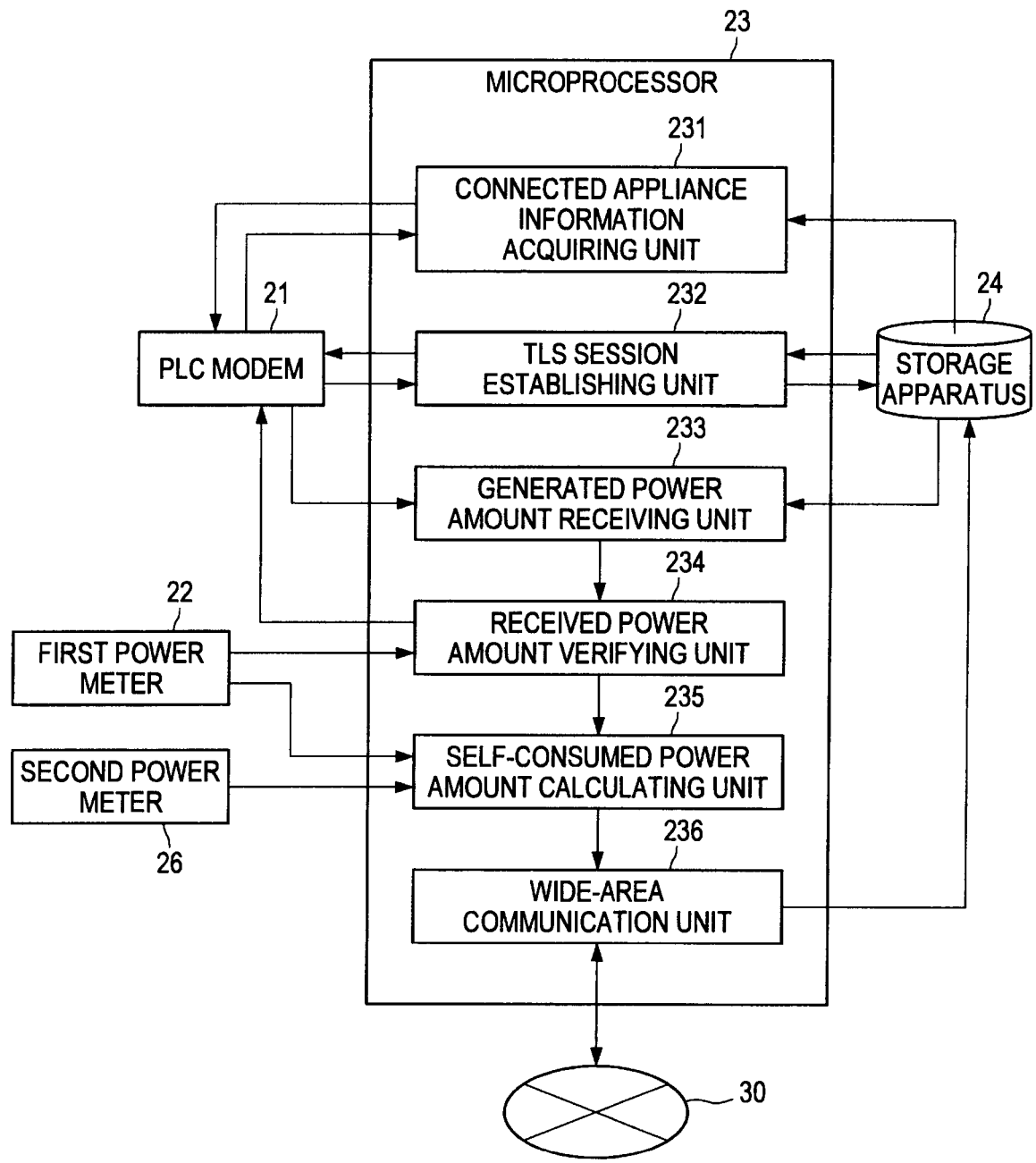
FIG. 3 is a diagram useful in explaining the functional configuration of a microprocessor included in a power conditioner according to the same embodiment.

Next, the functional configuration of the microprocessor 23 included in the power conditioner 20 will be described with reference to FIG. 3. FIG. 3 is a diagram useful in explaining the functional configuration of the microprocessor 23 included in the power conditioner 20.

As shown in FIG. 3, the microprocessor 23 includes a connected appliance information providing unit 231, a TLS session establishing unit 232, a generated power amount receiving unit 233, a received power amount verifying unit 234, a self-consumed power amount calculating unit 235, and a wide-area communication unit 236. Note that it is assumed that a program in which TCP/IP protocol is implemented has been installed in the microprocessor 23. It is also assumed that the microprocessor 23 is capable of communication with the microprocessor 13 included in the solar cell module 10 in accordance with TCP/IP protocol.

First, on receiving a request for connected appliance information from the microprocessor 13 included in the solar cell module 10, the connected appliance information providing unit 231 provides the connected appliance information of the power conditioner 20 via the PLC modem 21 to the solar cell module 10. As described above, if the validity of the connected appliance information has been confirmed by the microprocessor 13 included in the solar cell module 10, an attempt is made by the microprocessor 13 to establish a TLS session. First, the certificate of the solar cell module 10 is sent via the power line from the microprocessor 13 included in the solar cell module 10. This certificate is received by the PLC modem 21.

The certificate of the solar cell module 10 received by the PLC modem 21 is inputted into the TLS session establishing unit 232. Once the certificate of the solar cell module 10 has been inputted, the TLS session establishing unit 232 reads the root certificate from the storage apparatus 24 and confirms the validity of the inputted certificate. The TLS session establishing unit 232 reads the certificate of the power conditioner 20 from the storage apparatus 24 and transmits the certificate to the microprocessor 13 included in the solar cell module 10. Once the validity of the certificate has been confirmed by the microprocessor 13 included in the solar cell module 10, a session key is generated and the encrypted session key is sent via the power line. This encrypted session key is received by the PLC modem 21.

The encrypted session key that has been received by the PLC modem 21 is inputted into the TLS session establishing unit 232. Once the encrypted session key has been inputted, the TLS session establishing unit 232 reads a secret key from the storage apparatus 24 and decrypts the encrypted session key using such secret key. Here, the secret key is a secret key that forms a key pair with the public key included in the certificate of the power conditioner 20. The TLS session establishing unit 232 that has decrypted the session key stores the decrypted session key in the storage apparatus 24.

The TLS session establishing unit 232 also controls the PLC modem 21 to start receiving power from the solar cell module 10. The TLS session establishing unit 232 also notifies the generated power amount receiving unit 233 that a TLS session has been established. On being informed that a TLS session has been established, the generated power amount receiving unit 233 receives information on the generated power amount via the PLC modem 21 from the solar cell module 10. The generated power amount receiving unit 233 then inputs the information on the generated power amount received from the solar cell module 10 into the received power amount verifying unit 234.

When the receiving of power from the solar cell module 10 via the PLC modem 21 has commenced, the amount of power received via the PLC modem 21 is measured by the first power meter 22. Information on the amount of power (or "received power amount") measured by the first power meter 22 is inputted into the received power amount verifying unit 234. When the information on the generated power amount has been inputted from the generated power amount receiving unit 233 and the information on the received power amount has been inputted from the first power meter 22, the received power amount verifying unit 234 verifies whether the generated power amount and the received power amount match based on the inputted information.

If the generated power amount and the received power amount do not match, the received power amount verifying unit 234 controls the PLC modem 21 to stop the reception of power and the reception of information. Meanwhile, if the generated power amount and the received power amount match, the received power amount verifying unit 234 notifies the self-consumed power amount calculating unit 235 that the generated power amount and the received power amount match. On being notified that the generated power amount and the received power amount match, the self-consumed power amount calculating unit 235 calculates the self-consumed power amount by subtracting the amount of power (or "return power amount") measured by the second power meter 26 from the amount of power (or "received power amount") measured by the first power meter 22. The self-consumed power amount is the amount of power applied to the power lines in the home.

The self-consumed power amount calculating unit 235 that has calculated the self-consumed power amount inputs information on the calculated self-consumed power amount into the wide-area communication unit 236. Once the information on the self-consumed power amount has been inputted, the wide-area communication unit 236 transmits the inputted information on the self-consumed power amount via the network 30 to an issuing server for green power bonds. The issuing server for green power bonds that has received the information on the self-consumed power amount issues green power bonds that have a monetary value in keeping with the self-consumed power amount based on the received information and transmits the green power bonds to the power conditioner 20. The green power bonds transmitted by the issuing server for the green power bonds are received by the wide-area communication unit 236 and stored in the storage apparatus 24.

This completes the description of the functional configuration of the microprocessor 23.

1-2: Processing Flow Until Establishment of TLS Session

Figure 4:
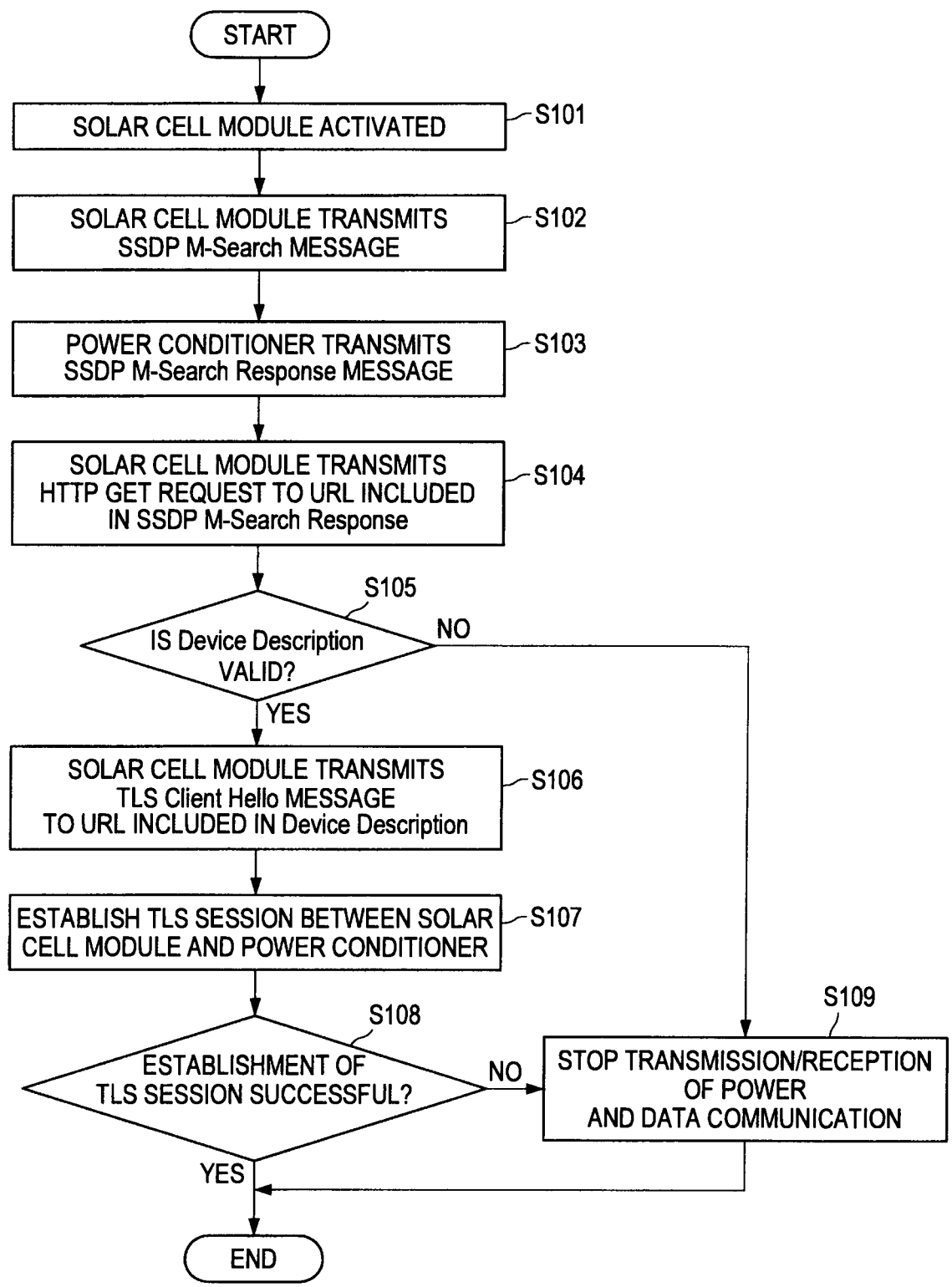
FIG. 4 is a diagram useful in explaining the processing flow implemented by the solar cell module and the power conditioner until establishment of a TLS session in the power system according to the same embodiment.

Next, the processing flow of the processing carried out by the solar cell module 10 and the power conditioner 20 until a TLS session is established will be described with reference to FIG. 4. FIG. 4 is a diagram useful in explaining the processing flow of the solar cell module 10 and the power conditioner 20 until establishment of a TLS session. Note that the individual processing steps that construct the processing flow shown in FIG. 4 are mainly realized by the respective structural elements of the microprocessors 13 and 23 described earlier.

As shown in FIG. 4, when the solar cell module 10 has started up (S101), first, the solar cell module 10 transmits an SSDP M-Search Message by a multicast using a function of the microprocessor 13 (S102). Here, an SSDP M-Search Message is a message that requests appliances which provide a specified type of network service to respond. The power conditioner 20 that has received this SSDP M-Search Message sends an SSDP M-Search Response using a function of the microprocessor 23 (S103).

In step S103, the power conditioner 20 sends the SSDP M-Search Response, in which a URL for acquiring its own device description is written, using a function of the microprocessor 23. Note that this "device description" corresponds to the "connected appliance information" described above. Also, the URL written in the "SSDP M-Search Response" is a pair of an IP address and a TCP port number. The response content of the power conditioner 20 is received by the solar cell module 10 in step S103.

Next, the solar cell module 10 that has received the SSDP M-Search Response reads the URL written in the SSDP M-Search Response using a function of the microprocessor 13. The solar cell module 10 then transmits an HTTP GET Request to the read URL using a function of the microprocessor 13 (S104). The HTTP GET Request transmitted from the solar cell module 10 is received by the power conditioner 20 in step S104.

After this, the power conditioner 20 that has received the HTTP GET Request writes the device description in an HTTP GET Response using a function of the microprocessor 23. The power conditioner 20 then transmits the HTTP GET Response to the solar cell module 10 using a function of the microprocessor 23. The HTTP GET Response transmitted here is received by the solar cell module 10.

Next, the solar cell module 10 that has received the HTTP GET Response determines whether the device description written in the HTTP GET Response is valid using a function of the microprocessor 13 (S105). If the content of the device description is valid, the processing by the solar cell module 10 proceeds to step S106. Meanwhile, if the content of the device description is not valid, the processing of the solar cell module 10 proceeds to step S109.

When the processing has proceeded to step S106, the solar cell module 10 transmits a TLS Client Hello message to the URL written in the device description using a function of the microprocessor 13 (S106). The TLS Client Hello message is a message for notifying a server (in this case, the power conditioner 20) of compatible encryption/compression algorithms and the like for the client (in this case, the solar cell module 10).

When the TLS Client Hello message has been transmitted from the solar cell module 10 to the power conditioner 20, a series of processes for establishing a TLS session is executed by both appliances. In such processes, first, the solar cell module 10 and the power conditioner 20 exchange certificates. After this, the solar cell module 10 confirms whether the certificate of the power conditioner 20 is valid. For example, the solar cell module 10 confirms, using a function of the microprocessor 13, the validity of the certificate acquired from the power conditioner 20 using the root certificate stored by the solar cell module 10 itself.

In the same way, the power conditioner 20 confirms whether the certificate of the solar cell module 10 is valid. For example, the power conditioner 20 confirms, using a function of the microprocessor 23, the validity of the certificate acquired from the solar cell module 10 using the root certificate stored by the power conditioner 20 itself. After the appliances have confirmed the validity of each other's certificate, the solar cell module 10 generates a session key using a function of the microprocessor 13. Using a function of the microprocessor 13, the solar cell module 10 then encrypts the session key using the public key included in the certificate of the power conditioner 20 and transmits the encrypted session key to the power conditioner 20.

The power conditioner 20 that has received the encrypted session key decrypts the encrypted session key using a function of the microprocessor 23. At this stage, the session key is shared between the solar cell module 10 and the power conditioner 20 and a TLS session is established. In this way, after the processing in step S106, an attempt is made to establish a TLS session between the solar cell module 10 and the power conditioner 20 (S107). After this, both the solar cell module 10 and the power conditioner 20 determine whether a TLS session has been established (S108), and when a TLS session has been established, the series of processes ends. Meanwhile, when the establishment of a TLS session has failed, the processing proceeds to step S109.

When the processing has proceeded from step S105 or step S108 to step S109, the solar cell module 10 and the power conditioner 20 cancel the transmission and reception of power and cancel transmission of data relating to information on the generated power amount and the like (S109). After this, the solar cell module 10 and the power conditioner 20 end the series of processes relating to the establishment of a TLS session.

This completes the description of the processing flow by the solar cell module 10 and the power conditioner 20 until the establishment of a TLS session. Although a configuration where the session key is generated on the solar cell module 10 side is described above, it is also possible to use a configuration where the session key is generated on the power conditioner 20 side. In such case, the session key is generated by the microprocessor 23 included in the power conditioner 20 and the session key is encrypted using the public key included in the certificate of the solar cell module 10 and sent from the power conditioner 20 to the solar cell module 10. Such slight modifications are obviously also included in the technical scope of the present embodiment.

Also, in the above description, there is a premise that the power conditioner 20 will have started up before startup of the solar cell module 10. If the solar cell module 10 starts up before the power conditioner 20, the solar cell module 10 may regularly transmit an SSDP M-Search Message and wait for the power conditioner 20 to start up. Alternatively, the solar cell module 10 may wait for an SSDP Notify Message transmitted when the power conditioner 20 starts up.

Note that a URL for acquiring a device description is also written in an SSDP Notify Message. For this reason, in cases where the solar cell module 10 has started up before the power conditioner 20, it is possible to modify the processing flow in FIG. 4 so as to use the SSDP Notify message described above. For example, the processing flow can be modified so that the processing in step S104 onwards is carried out after the solar cell module 10 has received an SSDP Notify message.

1-3: Processing Flow after Establishment of TLS Session

Figure 5:
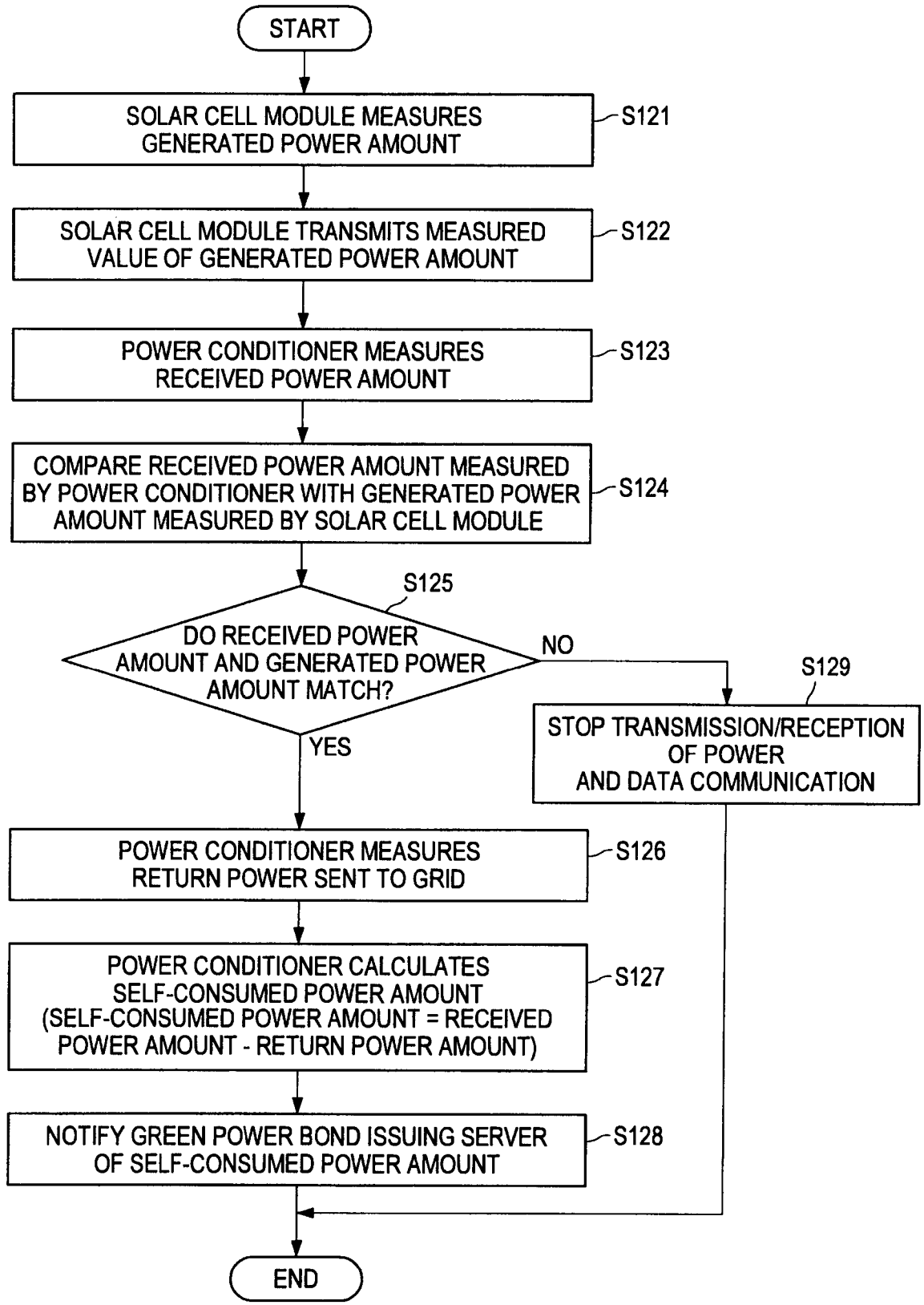
FIG. 5 is a diagram useful in explaining the flow of processing implemented by the solar cell module and the power conditioner after establishment of a TLS session in the power system according to the same embodiment.

Next, the flow of the processing executed by the solar cell module 10 and the power conditioner 20 after establishment of a TLS session will be described with reference to FIG. 5. FIG. 5 is a diagram useful in explaining the flow of processing executed by the solar cell module 10 and the power conditioner 20 after establishment of a TLS session. Note that the data communication between the solar cell module 10 and the power conditioner 20 is executed via a TLS session.

As shown in FIG. 5, first the solar cell module 10 measures the power amount generated by the solar cell panel 11 in a specified period using the power meter 12 (S121). Next, the solar cell module 10 transmits information on the generated power amount measured by the power meter 12 via the PLC modem 15 to the power conditioner 20 (S122). The power generated by the solar cell panel 11 is also transmitted to the power conditioner 20. Note that the information on the generated power amount transmitted in step S122 is received by the PLC modem 21 and inputted via the PLC modem 21 into the microprocessor 23.

The power conditioner 20 that has received power from the solar cell module 10 measures the amount of power received from the solar cell module 10 using the first power meter 22 (S123). Information on the generated power amount measured by the first power meter 22 is then inputted into the microprocessor 23. Next, using a function of the microprocessor 23, the power conditioner 20 compares the received power amount measured by the first power meter 22 and the generated power amount measured by the power meter 12 included in the solar cell module 10 (S124).

The power conditioner 20 then determines, using a function of the microprocessor 23, whether the received power amount and the generated power amount match (S125). If the received power amount and the generated power amount match, the processing of the power conditioner 20 proceeds to step S126. Meanwhile, if the received power amount and the generated power amount do not match, the processing of the power conditioner 20 proceeds to step S129. If the processing has proceeded to step S129, the solar cell module 10 and the power conditioner 20 cancel the transmission and reception of power and data communication (S129) and end the series of processes.

If the processing has proceeded to step S126, the power conditioner 20 uses the second power meter 26 to measure the power amount (return power amount) returned to the power grid (S126). Note that the information on the return power amount measured in step S126 is inputted into the microprocessor 23. Next, the power conditioner 20 calculates the self-consumed power amount by subtracting the return power amount from the received power amount using a function of the microprocessor 23 (S127). After this, using a function of the microprocessor 23, the power conditioner 20 notifies the issuing server for green power bonds of the self-consumed power amount calculated in step S127 (S128) and ends the series of processes.

This completes the description of the flow of processing executed by the solar cell module 10 and the power conditioner 20 after establishment of a TLS session. As described above, since the transmission and reception of power are stopped if the generated power amount and the received power amount do not match, it is possible to prevent green power bonds from being issued for power illegally applied to a power line. Also, by using a TLS session, it is possible to prevent tampering with the information on the generated power amount.

This completes the description of the first embodiment of the present disclosure. As described above, in the present embodiment, the security of the data communication carried out between the solar cell module 10 and the power conditioner 20 is ensured by the TLS session. Also, by controlling the transmission and reception of power based on the comparison between the generated power amount and the received power amount, illegal overstating of green power by connecting an external power source to the power line is prevented. For this reason, by applying the configuration of the present embodiment, it is possible to prevent illegal activity that overstates green power in an attempt to have bonds issued.

2: SECOND EMBODIMENT

Next, a second embodiment of the present disclosure will be described. The present embodiment relates to a configuration that uses the power conditioner 20 as a battery server. That is, the present embodiment relates to a configuration that does not immediately return power that has been transmitted from the solar cell module 10 to the power conditioner 20 to a grid and instead stores such power. A power system according to the present embodiment will now be described.

2-1: System Configuration

First, the system configuration of a power system according to the present embodiment will be described with reference to FIG. 6. FIG. 6 is a diagram useful in explaining the system configuration of the power system according to the present embodiment. Note that the system configuration of the power system illustrated in FIG. 6 is merely one example and it is also possible to apply the technology according to the present embodiment to an arbitrary system configuration that generates green power and notifies an issuing server for green power bonds of the generated amount of green power. However, the technology according to the present embodiment is described below based on the system configuration illustrated in FIG. 6.

Figure 6:
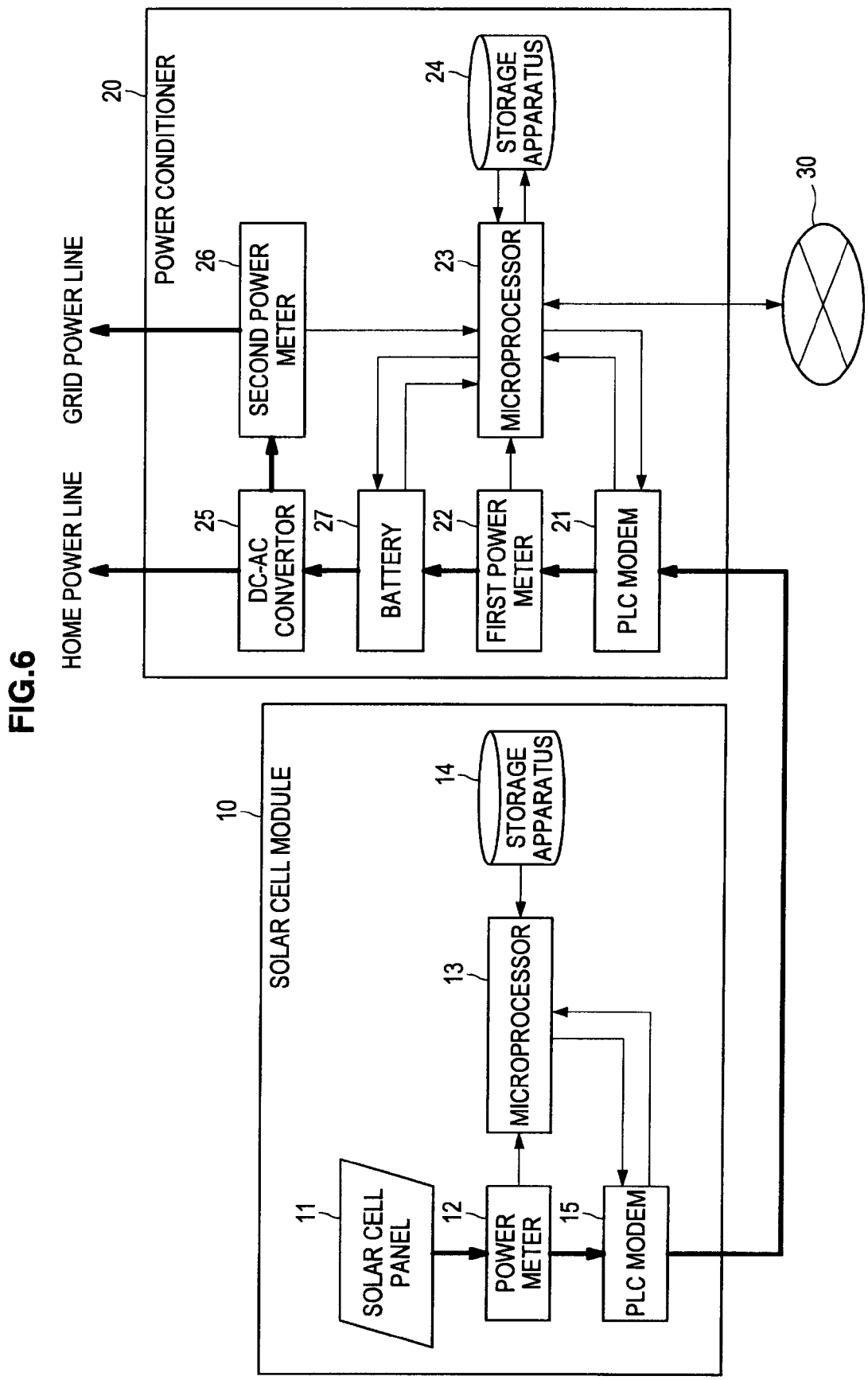
FIG. 6 is a diagram useful in explaining the system configuration of a power system according to a second embodiment of the present disclosure.

As shown in FIG. 6, in the same way as the power system according to the first embodiment described above, the power system according to the present embodiment includes the solar cell module 10 and the power conditioner 20. However, the power conditioner 20 has a function as a battery server. The solar cell module 10 and the power conditioner 20 include tamper-proof hardware. That is, if a user tampers with the solar cell module 10 or the power conditioner 20, such solar cell module 10 or power conditioner 20 will become unusable.

The solar cell module 10 includes the solar cell panel 11, the power meter 12, the microprocessor 13, the storage apparatus 14, and the PLC modem 15. The power conditioner 20 includes the PLC modem 21, the first power meter 22, the microprocessor 23, the storage apparatus 24, the DC-AC convertor 25, the second power meter 26, and a battery 27. Note that the solar cell module 10 has effectively the same configuration as the solar cell module 10 according to the first embodiment described above. Meanwhile, the power conditioner 20 differs to the power conditioner 20 according to the first embodiment described above in the presence of the battery 27 and a function of the microprocessor 23 for controlling such battery 27.

First, the solar cell module 10 generates green power according to a solar power generation method. When light is incident on the solar cell panel 11, electrical power is outputted from the solar cell panel 11 and inputted into the power meter 12. When power is inputted from the solar cell panel 11, the power meter 12 measures the power (hereinafter, "generated power amount") inputted from the solar cell panel 11 in a specified period. The power meter 12 then inputs information on the measured generated power amount into the microprocessor 13. The power inputted into the power meter 12 is also inputted into the PLC modem 15. When information on the generated power amount is inputted, the microprocessor 13 transmits the information on the generated power amount via the PLC modem 15 to the power conditioner 20.

At this time, the microprocessor 13 establishes a TLS session with the microprocessor 23 included in the power conditioner 20 and transmits the information on the generated power amount via an encrypted communication line. Note that the flow of the processing by the microprocessors 13, 23 until a TLS session has been established is effectively the same as the processing flow according to the first embodiment described above. It is also assumed that the certificates and the like used to establish a TLS session are stored in the storage apparatus 14 included in the solar cell module 10 and the storage apparatus 24 included in the power conditioner 20.

As mentioned above, the PLC modem 15 receives an input of power (i.e., a DC current) from the power meter 12 and an input of the information on the generated power amount from the microprocessor 13. The PLC modem 15 superimposes the information on the generated power amount onto the power and transmits the power and the information on the generated power amount via a power line to the PLC modem 21 included in the power conditioner 20. At this time, the PLC modem 15 modulates the information on the generated power amount to generate a signal that does not have a DC component and transmits such signal superimposed on the power. Meanwhile, the PLC modem 21 included in the power conditioner 20 separates the power and the information on the generated power amount, inputs the power into the first power meter 22, and inputs the information on the generated power amount into the microprocessor 23.

When power is inputted from the PLC modem 21, the first power meter 22 measures the amount (hereinafter "received power amount") of power that is inputted. The first power meter 22 then inputs information on the received power amount into the microprocessor 23. When information on the generated power amount and information on the received power amount have been inputted, the microprocessor 23 compares the generated power amount and the received power amount based on the inputted information. When the generated power amount and the received power amount match, the microprocessor 23 allows the PLC modem 21 to continue receiving power and receiving the information on the generated power amount. Meanwhile, when the generated power amount and the received power amount do not match, the microprocessor 23 stops the PLC modem 21 receiving power and receiving the information on the generated power amount.

In this way, by confirming whether the generated power amount and the received power amount match, it is possible to immediately detect the presence of power inputted from outside onto the power line that connects the solar cell module 10 and the power conditioner 20. Also, as described above, by immediately stopping the receiving of power by the PLC modem 21 when the generated power amount and the received power amount do not match, it is possible to immediately prevent green power bonds from being issued based on illegally supplied power. Note that in the same way as in the first embodiment described above, the microprocessor 23 determines whether the generated power amount and the received power amount match within the range of an error that takes into consideration losses occurring on power lines and the like.

The power inputted from the PLC modem 21 into the first power meter 22 is then inputted into the battery 27. The battery 27 is a power storage device for temporarily storing power. As the battery 27, as examples it is possible to use a lithium ion cell, a nickel metal hydride cell, a lead storage cell, an NAS cell (sodium-sulfur battery) cell, a field effect capacitor, a ceramic capacitor, and an electrical double-layer capacitor. Discharge control over the power stored in the battery 27 is carried out by the microprocessor 23. In addition, information relating to the power stored in the battery 27, such as the stored amount of power or the charging state of the battery 27, is successively inputted into the microprocessor 23.

The power discharged from the battery 27 is inputted into the DC-AC convertor 25. When power is inputted from the first power meter 22, the DC-AC convertor 25 converts the inputted DC power to AC. The DC-AC convertor 25 then applies some of the power converted to AC to power lines installed in the home and inputs the remaining power into the second power meter 26. The second power meter 26 measures the amount (hereinafter "return power amount") of the inputted power and inputs information on the return power amount into the microprocessor 23. The power inputted from the DC-AC convertor 25 into the second power meter 26 is returned via a grid power line to a power grid.

When the information on the return power amount has been inputted, the microprocessor 23 subtracts the return power amount from the amount of discharged power (hereinafter, "discharged power amount") to calculate an amount (hereinafter "self-consumed power amount") of power that has been applied to the power lines installed in the home. The microprocessor 23 then provides, via a network 30, an issuing server for green power bonds with information on the self-consumed power amount. Note that an arrangement where green power bonds are issued for green power consumed in the home is described here. However, in the case of an arrangement where green power bonds are issued for the discharged power amount that includes the return power amount, information on the discharged power amount is transmitted from the microprocessor 23 to the issuing server for the green power bonds.

As described earlier, the received power amount is a power amount calculated by subtracting losses that occur due to power lines and the like from the generated power amount. In the same way, the discharged power amount is a power amount that takes into account losses that occur during charging and discharging into and out of the battery 27. In the same way, the self-consumed power amount calculated from the discharged power amount is a power amount calculated by subtracting losses that occur due to power lines and the like.

The green power bonds should preferably be issued for an amount of power that has been generated by a green power generating apparatus and can actually be used. That is, it is preferable to recognize the additional environmental value of the amount of power that can be used in place of power generated by thermal power generation or the like and to issue green power bonds, which have a monetary value, for such additional environmental value. Based on this viewpoint, the microprocessor 23 according to the present embodiment is configured to inform the issuing server for green power bonds of the self-consumed power amount (or discharged power amount).

This completes the description of the system configuration of the power system according to the present embodiment.

2-1-1: Functional Configuration of Microprocessor 23

Figure 7:
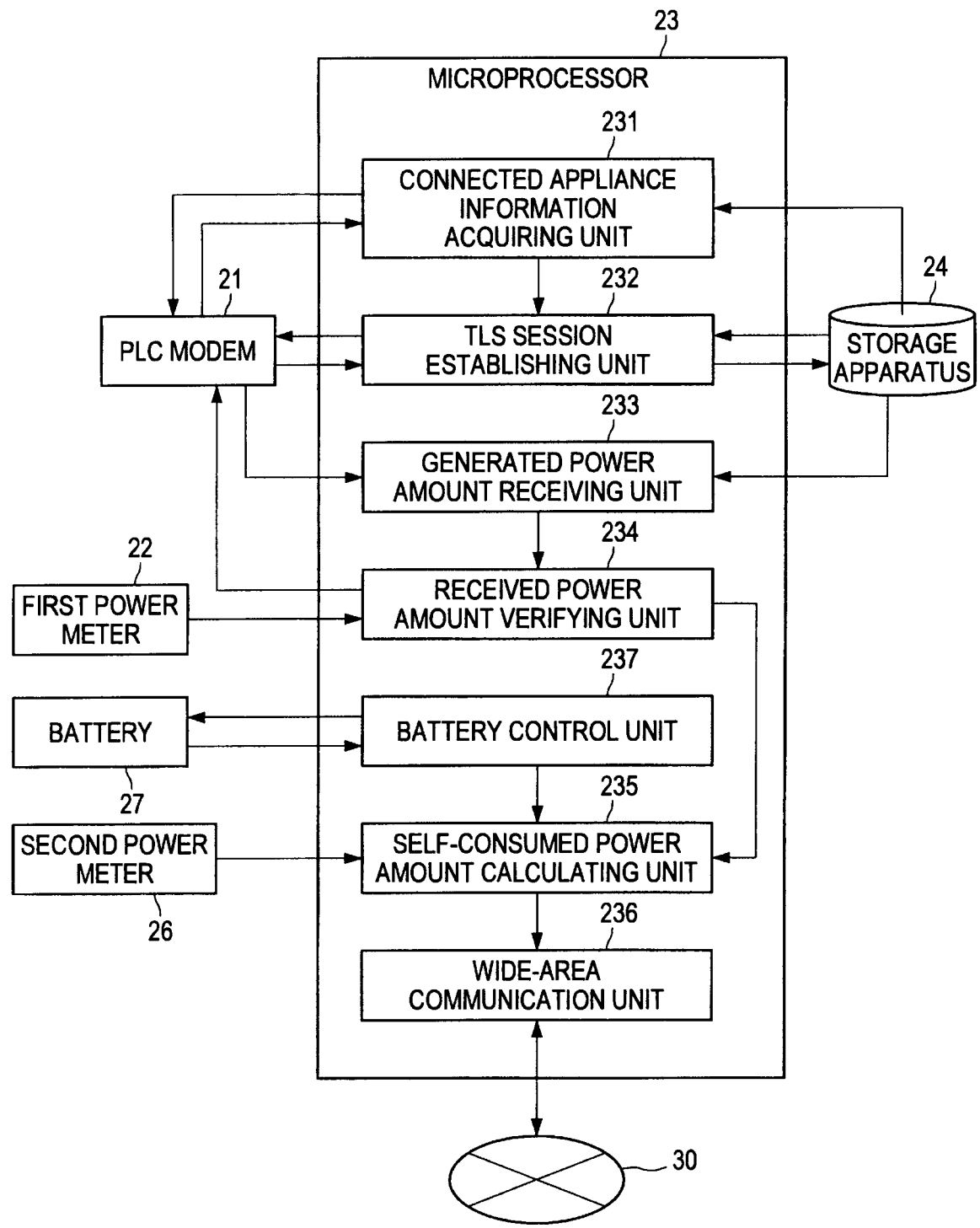
FIG. 7 is a diagram useful in explaining the functional configuration of a microprocessor included in a power conditioner according to the same embodiment.

Next, the functional configuration of the microprocessor 23 included in the power conditioner 20 will be described with reference to FIG. 7. FIG. 7 is a diagram useful in explaining the functional configuration of the microprocessor 23 included in the power conditioner 20. Note that since the functional configuration of the microprocessor 13 included in the solar cell module 10 is effectively the same as the functional configuration of the microprocessor 13 according to the first embodiment described above, detailed description thereof is omitted.

As shown in FIG. 7, the microprocessor 23 includes the connected appliance information providing unit 231, the TLS session establishing unit 232, the generated power amount receiving unit 233, the received power amount verifying unit 234, the self-consumed power amount calculating unit 235, the wide-area communication unit 236, and a battery control unit 237.

Note that it is assumed that a program in which TCP/IP protocol is implemented has been installed in the microprocessor 23. It is also assumed that the microprocessor 23 is capable of communication with the microprocessor 13 included in the solar cell module 10 in accordance with TCP/IP protocol. The main differences with the microprocessor 23 according to the first embodiment described above are the presence of the battery control unit 237 and the method of calculating the self-consumed power amount carried out by the self-consumed power amount calculating unit 235.

First, on receiving a request for connected appliance information from the microprocessor 13 included in the solar cell module 10, the connected appliance information providing unit 231 provides the connected appliance information of the power conditioner 20 via the PLC modem 21 to the solar cell module 10. As described above, if the validity of the connected appliance information has been confirmed by the microprocessor 13 included in the solar cell module 10, an attempt is made by the microprocessor 13 to establish a TLS session. First, a certificate of the solar cell module 10 is sent via the power line from the microprocessor 13 included in the solar cell module 10. This certificate is received by the PLC modem 21.

The certificate of the solar cell module 10 received by the PLC modem 21 is inputted into the TLS session establishing unit 232. Once the certificate of the solar cell module 10 has been inputted, the TLS session establishing unit 232 reads the root certificate from the storage apparatus 24 and confirms the validity of the inputted certificate. The TLS session establishing unit 232 reads the certificate of the power conditioner 20 from the storage apparatus 24 and transmits the certificate to the microprocessor 13 included in the solar cell module 10. Once the validity of the certificate has been confirmed by the microprocessor 13 included in the solar cell module 10, a session key is generated and the encrypted session key is sent via the power line. This encrypted session key is received by the PLC modem 21.

The encrypted session key that has been received by the PLC modem 21 is inputted into the TLUs session establishing unit 232. Once the encrypted session key has been inputted, the TLS session establishing unit 232 reads a secret key from the storage apparatus 24 and decrypts the encrypted session key using such secret key. Here, the secret key is a secret key that forms a key pair with the public key included in the certificate of the power conditioner 20. The TLS session establishing unit 232 that has decrypted the session key stores the decrypted session key in the storage apparatus 24.

The TLS session establishing unit 232 also controls the PLC modem 21 and starts receiving power from the solar cell module 10. The TLS session establishing unit 232 also notifies the generated power amount receiving unit 233 that a TLS session has been established. On being informed that a TLS session has been established, the generated power amount receiving unit 233 receives information on the generated power amount via the PLC modem 21 from the solar cell module 10. The generated power amount receiving unit 233 then inputs the information on the generated power amount received from the solar cell module 10 into the received power amount verifying unit 234.

When the receiving of power via the PLC modem 21 from the solar cell module 10 has commenced, the amount of power received via the PLC modem 21 is measured by the first power meter 22. Information on the amount of power (or "received power amount") measured by the first power meter 22 is inputted into the received power amount verifying unit 234. When the information on the generated power amount has been inputted from the generated power amount receiving unit 233 and the information on the received power amount has been inputted from the first power meter 22, the received power amount verifying unit 234 verifies whether the generated power amount and the received power amount match based on the inputted information.

If the generated power amount and the received power amount do not match, the received power amount verifying unit 234 controls the PLC modem 21 to stop the reception of power and the reception of information. Meanwhile, if the generated power amount and the received power amount match, the received power amount verifying unit 234 notifies the self-consumed power amount calculating unit 235 that the generated power amount and the received power amount match. On being notified that the generated power amount and the received power amount match, the self-consumed power amount calculating unit 235 calculates the self-consumed power amount. The self-consumed power amount is obtained by subtracting the amount of power ("return power amount") measured by the second power meter 26 from the amount of power discharged from the battery 27.

Discharge control for the battery 27 is carried out by the battery control unit 237. The battery control unit 237 designates an amount of power to be discharged from the battery 27 to have the designated amount of power discharged from the battery 27. When the battery control unit 237 has power discharged from the battery 27, information on the amount of power discharged from the battery 27 is inputted into the self-consumed power amount calculating unit 235. The self-consumed power amount calculating unit 235 then calculates the self-consumed power amount based on the information on the discharged power amount inputted from the battery control unit 237. This self-consumed power amount is the amount of power applied to the power lines in the home.

Note that the battery control unit 237 may be configured so as to monitor the amount of power stored in the battery 27. In such case, the battery control unit 237 is capable of calculating the losses that occur when the battery 27 is charged from the received power amount measured by the first power meter 22, the stored power amount of the battery 27, and the amount of power discharged from the battery 27. Note that since the self-consumed power amount calculating unit 235 calculates the self-consumed power amount using the return power amount measured by the second power meter 26 disposed downstream of the battery 27, the loss that occurs during charging of the battery 27 has already been taken into consideration.

The self-consumed power amount calculating unit 235 inputs information on the calculated self-consumed power amount into the wide-area communication unit 236. Once the information on the self-consumed power amount has been inputted, the wide-area communication unit 236 transmits the inputted information on the self-consumed power amount via the network 30 to an issuing server for green power bonds. The issuing server for green power bonds that has received the information on the self-consumed power amount issues green power bonds that have a monetary value in keeping with the self-consumed power amount based on the received information and transmits the green power bonds to the power conditioner 20. The green power bonds transmitted by the issuing server for the green power bonds are received by the wide-area communication unit 236 and stored in the storage apparatus 24.

This completes the description of the functional configuration of the microprocessor 23.

2-2: Processing Flow After Establishment of TLS Session

Next, the flow of the processing executed by the solar cell module 10 and the power conditioner 20 after establishment of a TLS session will be described with reference to FIG. 8. FIG. 8 is a diagram useful in explaining the flow of processing executed by the solar cell module 10 and the power conditioner 20 after establishment of a TLS session. Note that the data communication between the solar cell module 10 and the power conditioner 20 is executed via a TLS session. Also, since the flow of the processing executed by the solar cell module 10 and the power conditioner 20 until the establishment of a TLS session is effectively the same as the first embodiment described above, description thereof is omitted.

As shown in FIG. 8, first the solar cell module 10 measures the power amount generated by the solar cell panel 11 in a specified period using the power meter 12 (S201). Next, the solar cell module 10 transmits information on the generated power amount measured by the power meter 12 via the PLC modem 15 to the power conditioner 20 (S202). The power generated by the solar cell panel 11 is also transmitted to the power conditioner 20. Note that the information on the generated power amount transmitted in step S202 is received by the PLC modem 21 and inputted via the PLC modem 21 into the microprocessor 23.

The power conditioner 20 that has received power from the solar cell module 10 measures the amount of power received from the solar cell module 10 using the first power meter 22 (S203). Information on the generated power amount measured by the first power meter 22 is then inputted into the microprocessor 23. Next, using a function of the microprocessor 23, the power conditioner 20 compares the received power amount measured by the first power meter 22 and the generated power amount measured by the power meter 12 included in the solar cell module 10 (S204).

The power conditioner 20 then determines, using a function of the microprocessor 23, whether the received power amount and the generated power amount match (S205). If the received power amount and the generated power amount match, the processing of the power conditioner 20 proceeds to step S206. Meanwhile, if the received power amount and the generated power amount do not match, the processing of the power conditioner 20 proceeds to step S210. If the processing has proceeded to step S210, the solar cell module 10 and the power conditioner 20 cancel the transmission and reception of power and data communication (S210) and end the series of processes.

If the processing has proceeded to step S206, the power conditioner 20 uses a function of the battery control unit 237 to discharge power from the battery 27 (S206). The power conditioner 20 then uses the second power meter 26 to measure the power amount (return power amount) returned to the power grid (S207). Note that the information on the return power amount measured in step S207 is inputted into the microprocessor 23. Next, the power conditioner 20 calculates the self-consumed power amount by subtracting the return power amount from the discharged power amount using a function of the microprocessor 23 (S208). After this, using a function of the microprocessor 23, the power conditioner 20 notifies the issuing server for green power bonds of the self-consumed power amount calculated in step S208 (S209) and ends the series of processes.

This completes the description of the flow of processing executed by the solar cell module 10 and the power conditioner 20 after establishment of a TLS session. As described above, since the transmission and reception of power are stopped if the generated power amount and the received power amount do not match, it is possible to prevent green power bonds from being issued based on power illegally applied to the power line. Also, by using a TLS session, it is possible to prevent tampering with the information on the generated power amount. In addition, since the self-consumed power amount is calculated based on the return power amount measured by the second power meter 26 disposed downstream of the battery 27 and the discharged power amount, it is possible to issue green power bonds based on a self-consumed power amount that has taken into account the losses incurred when charging the battery 27.

This completes the description of the second embodiment of the present disclosure. As described above, in the present embodiment, the security of the data communication carried out between the solar cell module 10 and the power conditioner 20 is ensured by the TLS session. Also, by controlling the transmission and reception of power based on the comparison between the generated power amount and the received power amount, illegal overstating of green power by connecting an external power source to the power line is prevented. For this reason, by applying the configuration of the present embodiment, it is possible to prevent illegal activity that overstates green power in an attempt to have bonds issued. Also, since the self-consumed power amount that decides the monetary value of the green power bonds is calculated by taking into account the losses that occur when the battery 27 is discharged, it is possible to issue green power bonds that reflect the additional environmental value more precisely.

3: THIRD EMBODIMENT

Next, a third embodiment of the present disclosure will be described. The present embodiment relates to an arrangement for connecting a plurality of solar cell modules 10A, 10B, and 10C to the power conditioner 20.

As described earlier, the solar cell module 10 and the power conditioner 20 according to the first and second embodiments described above include tamper-proof hardware. However, in cases where a plurality of comparatively low cost solar cell modules 10A, 10B, and 10C are combined to construct a single large solar cell module 10, it will often be difficult to make the hardware of such large solar cell module 10 tamper-proof. For this reason, the present embodiment proposes an arrangement for gathering information on generated power amounts that have been measured by the plurality of solar cell modules 10A, 10B, and 10C and then transmitting such information to the power conditioner 20.

3-1: System Configuration

First, the system configuration of the power system according to the present embodiment will be described with reference to FIG. 9. FIG. 9 is a diagram useful in explaining the system configuration of the power system according to the present embodiment. Note that the system configuration of the power system illustrated in FIG. 9 is merely one example and it is also possible to apply the technology according to the present embodiment to an arbitrary system configuration that generates green power and notifies an issuing server for green power bonds of the generated amount of green power. However, the technology according to the present embodiment is described below based on the system configuration illustrated in FIG. 9.

As shown in FIG. 9, the power system according to the present embodiment includes the plurality of solar cell modules 10A, 10B, and 10C, a power collector apparatus 40, and a power conditioner 20. The individual solar cell modules 10A, 10B, and 10C and the power conditioner 20 have effectively the same functional configurations as the solar cell module 10 and the power conditioner 20 according to the first embodiment described above. The main differences with the first embodiment described above are the presence of the power collector apparatus 40 and the functional configuration thereof. For this reason, the following description focuses on the configuration of the power collector apparatus 40.

As shown in FIG. 9, the power collector apparatus 40 includes a PLC modem 41, a power meter 42, a microprocessor 43, and a storage apparatus 44. The microprocessor 43 includes a connected appliance information managing unit 431, a TLS session establishing unit 432, a generated power amount receiving unit 433, a received power amount verifying unit 434, a total generated power amount calculating unit 435, and a total generated power amount transmitting unit 436.

First, when the solar cell modules 10A, 10B, and 10C start up, TLS sessions are established between the individual solar cell modules 10A, 10B, and 10C and the power collector apparatus 40. The flow of the process that establishes the TLS sessions is effectively the same as the first embodiment described above, and is executed by the microprocessors 13 included in the individual solar cell modules 10A, 10B, and 10C and the microprocessor 43 included in the power collector apparatus 40. When doing so, on the microprocessor 43 side, the transmission of connected appliance information is executed by the connected appliance information managing unit 431 and an authentication process relating to the establishment of a TLS session is executed by the TLS session establishing unit 432.

Note that information used when establishing the TLS sessions described above, such as a certificate of the power collector apparatus 40, a secret key that forms a key pair with the public key included in the certificate, and a root certificate is stored in the storage apparatus 44. Once the TLS sessions have been established, the transmission of power from the solar cell modules 10A, 10B, and 10C commences. The power transmitted from the solar cell modules 10A, 10B, and 10C is received by the PLC modem 41 and inputted into the power meter 42. The power meter 42 measures the amount (or "received power amount") of power inputted from the PLC modem 41 and inputs information on the received power amount into the microprocessor 43.

The solar cell modules 10A, 10B, and 10C also transmit information on their respective generated power amounts to the power collector apparatus 40. The information on the generated power amounts transmitted from the solar cell modules 10A, 10B, and 10C is received by the PLC modem 41 and is inputted from the PLC modem 41 into the microprocessor 43. Note that the information on the generated power amounts inputted from the PLC modem 41 is received by a function of the generated power amount receiving unit 433 included in the microprocessor 43. The information on the generated power amount received by the generated power amount receiving unit 433 is then inputted into the received power amount verifying unit 434.

The received power amount verifying unit 434 then verifies whether the generated power amounts and the received power amounts for the power received from the individual solar cell modules 10A, 10B, and 10C match. If the generated power amounts and the received power amounts match, the received power amount verifying unit 434 allows the reception of power and the reception of information to continue. Meanwhile, if the generated power amounts and the received power amounts do not match, the received power amount verifying unit 434 stops the reception of power and the reception of information. For the solar cell modules 10A, 10B, and 10C where the received power amount and the generated power amount match, the received power amount verifying unit 434 inputs the information on the generated power amounts into the total generated power amount calculating unit 435. When the information on the generated power amounts has been inputted, the total generated power amount calculating unit 435 totals the generated power amounts based on the inputted information and thereby calculates a total generated power amount. The total generated power amount calculated by the total generated power amount calculating unit 435 is then inputted into the total generated power amount transmitting unit 436.

After this, a TLS session is established between the power collector apparatus 40 and the power conditioner 20. Note that the flow of the process establishing the TLS session is effectively the same as the first embodiment described above and is executed by the microprocessor 23 included in the power conditioner 20 and the microprocessor 43 included in the power collector apparatus 40. Note that the information used when establishing the TLS session described above, such as a certificate of the power collector apparatus 40, a secret key that forms a pair with the public key included in the certificate, and a root certificate, is stored in the storage apparatus 44.

Once a TLS session has been established, the power received via the PLC modem 41 from the solar cell modules 10A, 10B, and 10C is transmitted to the power conditioner 20. The microprocessor 43 also uses a function of the total generated power amount transmitting unit 436 to transmit information on the total generated power amount to the power conditioner 20 using the TLS session. That is, the total power generated by the solar cell modules 10A, 10B, and 10C and information on the total generated power amount showing the total of the generated power amounts of the solar cell modules 10A, 10B, and 10C are inputted into the power conditioner 20. The power conditioner 20 verifies whether the received power amount for the total generated power and the total generated power amount match and stops the reception of power and the reception of information if both values do not match.

This completes the description of the configuration of the power system according to the third embodiment of the present disclosure focusing on the functional configuration of the power collector apparatus 40. As described above, in the present embodiment, the security of the data communication carried out between the solar cell modules 10, the power collector apparatus 40, and the power conditioner 20 is ensured by the TLS sessions. Also, by controlling the transmission and reception of power based on the comparison between the generated power amount and the received power amount, illegal overstating of green power by connecting an external power source to the power line is prevented. For this reason, by applying the configuration of the present embodiment, it is possible to prevent illegal activity that overstates green power in an attempt to have bonds issued. It is also possible to prevent the illegal activity described above even when a single solar cell module 10 including a plurality of solar cell modules 10A, 10B, and 10C is not provided with tamper-proof hardware.

4: CONCLUSION

Finally, the technical content of the embodiments of the present disclosure will be summarized in brief. The technical content described here relates to a power system that can be applied to a power generation system or power storage system in the home and/or a power generation system or power storage system managed by a power company or the like.

The configuration of the power system described above can be expressed as follows. Such power system includes a power transmitting apparatus and a power receiving apparatus as described below.

Such "power transmitting apparatus" includes the power generating unit, the first power measuring unit, and the power transmitting unit described as follows. The power generating unit is a power generating apparatus that generates power using renewable energy or the like. Examples of such a power generating apparatus include a solar power generating apparatus, a wind power generating apparatus, a geothermal power generating apparatus, a hydroelectric power generating apparatus, and a fuel cell.

The first power measuring unit mentioned above is a device that measures the amount of power generated by the power generating unit in a specified period. In addition, the power transmitting unit mentioned above is a device that transmits the power generated by the power transmitting unit in the specified period and information on the power amount measured by the first power measuring unit to a power receiving apparatus. For example, the power transmitting unit described above transmits power amounts, which are regularly or irregularly measured by the first power measuring unit, to the power receiving apparatus. Note that the power transmitting unit described above may be configured so as to superimpose information on the power amount onto a DC current and transmit power and the information via a power line. As one example, the power transmitting unit described above may modulate data showing the information on the power amount onto a signal with a waveform that does not include a DC component and transmit such signal superimposed on a DC current.

Meanwhile, the power receiving apparatus mentioned above includes a power receiving unit, a second power measuring unit, a determining unit, and a power reception control unit. The power receiving unit is a device that receives the power transmitted from the power transmitting apparatus and also receives the information on the power amount received from the power transmitting apparatus. For example, when the information on the power amount has been transmitted superimposed on a DC current, the power receiving unit separates the information on the power amount and the DC current, inputs the information on the power amount into the determining unit, and inputs the DC current into the second power measuring unit mentioned above. First, the second power measuring unit described above measures the amount of power received by the power receiving unit in the specified period. The information on the power amount measured by the second power measuring unit described above is then inputted into the determining unit mentioned above.

The determining unit compares the information on the power amount received by the receiving unit and the information on the power amount measured by the second power measuring unit to determine whether the two power amounts match. If the determining unit has determined that the two power amounts do not match, the power reception control unit stops the reception of power and the reception of information by the receiving unit. That said, the two power amounts described above will normally match. However, if power is being applied from outside midway onto (or is leaking from) a power line that joins the power transmitting apparatus and the power receiving apparatus, the two power amounts mentioned above will not match.

As described earlier, the amount of power generated using renewable energy is used to issue green power bonds and provide an additional monetary value. For this reason, it is feared that users will attempt to pass off power generated using energy aside from renewable energy as power that comes from renewable energy to illegally obtain green power bonds. One conceivable example of such illegal activity would be illegally applying low-cost power that doesn't come from renewable energy onto the power line that transmits power from the power transmitting apparatus to the power receiving apparatus. However, with the power system according to the present embodiment, since the transmission and reception of power are stopped immediately when illegal activity such as that described above has occurred, it is possible to prevent the mistaken issuance of green power bonds in response to such illegal activity.

Comments

The solar cell module 10 described above is one example of the "power transmitting apparatus" for the present disclosure. The power conditioner 20 described above is one example of the "power receiving apparatus". The power meter 12 described above is one example of the "first power measuring unit". The PLC modem 15 described above is one example of the "power transmitting unit". The PLC modem 21 described above is one example of the "power receiving unit". The first power meter 22 described above is one example of the "second power measuring unit". The microprocessor 23 described above is one example of the "determining unit" and the "power reception control unit". The microprocessor 13 described above is one example of the "appliance information acquiring unit", the "validity confirming unit", the "certificate exchanging unit", and the "session establishing unit". The battery 27 described above is one example of the "power storing unit".

The second power meter 26 described above is one example of the "third power measuring unit". The microprocessor 23 is one example of the "external communication unit". The solar cell modules 10A, 10B, and 10C described above are examples of the "power generating modules". The solar cell modules 10A, 10B, and 10C and the power collector apparatus 40 described above may be combined to configure the "power transmitting apparatus". In such case, the solar cell modules 10A, 10B, and 10C and the power collector apparatus 40 described above are an example of the "power transmitting apparatus". The microprocessor 43 described above is one example of the "power amount totaling unit".

Although preferred embodiments of the present disclosure have been described in detail with reference to the attached drawings, the present disclosure is not limited to the above examples. It should be understood by those skilled in the art that various modifications, combinations, sub-combinations and alterations may occur depending on design requirements and other factors insofar as they are within the scope of the appended claims or the equivalents thereof.

As one example, although a configuration where a certificate is sent first from the solar cell module 10 to the power conditioner 20 when establishing a TLS session has been described above, a configuration where a certificate is sent first from the power conditioner 20 to the solar cell module 10 may be used. That is, a TLS session may be established according to a flow where the power conditioner 20 sends its own certificate to the solar cell module 10, the solar cell module 10 uses such certificate to authenticate the power conditioner 20, the solar cell module 10 then sends its own certificate to the power conditioner 20, and the power conditioner 20 uses such certificate to authenticate the solar cell module 10.

Also, although an RSA key exchange algorithm where the solar cell module 10 encrypts and transmits a session key has been described above, it is possible to use an arbitrary algorithm as the key exchange algorithm. That is, it is possible to use a configuration where a session key is generated based on a key exchange algorithm agreed upon by both the solar cell module 10 and the power conditioner 20.

The present disclosure contains subject matter related to that disclosed in Japanese Priority Patent Application JP 2010-155114 filed in the Japan Patent Office on Jul. 7, 2010, the entire content of which is hereby incorporated by reference.

What is claimed is:

1. A power system comprising a power transmitting apparatus and a power receiving apparatus,
wherein the power transmitting apparatus includes:
a power generating unit generating power using renewable energy;
a first power measuring unit measuring a power amount of power generated by the power generating unit in a specified period; and
a power transmitting unit transmitting the power generated by the power generating unit in the specified period and information on the power amount measured by the first power measuring unit to the power receiving apparatus, and
the power receiving apparatus includes:
a power receiving unit receiving the power transmitted from the power transmitting apparatus and receiving the information on the power amount transmitted from the power transmitting apparatus;
a second power measuring unit measuring a power amount of the power received by the power receiving unit in the specified period;
a determining unit comparing the information on the power amount received by the power receiving unit and information on the power amount measured by the second power measuring unit and determining whether the two power amounts match; and
a power reception control unit operable when the determining unit has determined that the two power amounts do not match, to stop the power receiving unit from receiving the power and from receiving the information.

2. The power system according to claim 1,
wherein the power transmitting apparatus further includes:
an appliance information acquiring unit acquiring appliance information including connected appliance information from the power receiving apparatus;
a validity confirming unit confirming the validity of the appliance information acquired by the appliance information acquiring unit;
a certificate exchanging unit operable when the validity has been confirmed by the validity confirming unit, to exchange certificates with the power receiving apparatus shown by the connected appliance information included in the appliance information; and a session establishing unit establishing an encrypted communication path for communication with the power receiving apparatus using the certificates exchanged by the certificate exchanging unit, wherein the power transmitting unit is operable when an encrypted communication path has been established with the power receiving apparatus by the session establishing unit, to transmit the information on the power amount measured by the first power measuring unit to the power receiving apparatus via the encrypted communication path.

3. The power system according to claim 2, wherein the power transmitting unit is operable when validity of the appliance information was not confirmed by the validity confirming unit or when the encrypted communication path has not been established by the session establishing unit, to transmit neither the power generated by the power generating unit nor the information on the power amount measured by the first power measuring unit to the power receiving apparatus.

4. The power system according to claim 1, wherein the power receiving apparatus further includes:

a power storing unit storing power received by the power receiving unit;

a third power measuring unit measuring a power amount of power discharged from the power storing unit; and an external communication unit transmitting information on the power amount measured by the third power measuring unit to an issuing apparatus for securities granted in keeping with a power amount of power generated from renewable energy.

5. The power system according to claim 1, wherein the power transmitting apparatus includes:

a plurality of power generating modules that include the power generating unit and the first power measuring unit; and a power amount totaling unit calculating a total power amount by totaling, for each power generating module out of the plurality of power generating modules, the power amount measured by the first power measuring unit included in the power generating module, and the power transmitting unit transmits the power generated by the power generating unit included in each power generating module and information on the total power amount calculated by the power amount totaling unit to the power receiving apparatus.

6. The power system according to claim 1, wherein the power transmission apparatus further includes:

an appliance information acquiring unit acquiring appliance information including connected appliance information from the power receiving apparatus;

a validity confirming unit confirming the validity of the appliance information acquired by the appliance information acquiring unit;

a session establishing unit operable when validity has been confirmed by the validity confirming unit, to establish an encrypted communication path for communication with the power receiving apparatus according to an authentication method that uses a shared key, and wherein the power transmitting unit is operable when an encrypted communication path has been established with the power receiving apparatus by the session establishing unit, to transmit the information on the power amount measured by the first power measuring unit to the power receiving apparatus via the encrypted communication path.

7. A power receiving apparatus comprising:

a power receiving unit receiving power transmitted from a power transmitting unit of a power transmitting apparatus and receiving information on a power amount transmitted from the power transmitting unit, the power transmitting apparatus including a power generating unit generating the power using renewable energy, a first power measuring unit measuring the power amount of the power generated by the power generating unit in a specified period, and the power transmitting unit transmitting the power generated by the power generating unit in the specified period and the information on the power amount measured by the first power measuring unit to the power receiving apparatus;

a second power measuring unit measuring a power amount of the power received by the power receiving unit in the specified period;

a determining unit comparing the information on the power amount received by the power receiving unit and information on the power amount measured by the second power measuring unit and determining whether the two power amounts match; and a power reception control unit operable when the determining unit has determined that the two power amounts do not match, to stop the power receiving unit from receiving the power and from receiving the information.

8. A power transmission control method comprising:

generating, by a power transmitting apparatus, power using renewable energy;

measuring, by the power transmitting apparatus, a power amount of the power generated in a specified period;

transmitting, by the power transmitting apparatus, the power generated in the specified period and information on the power amount measured by the power transmitting apparatus to a power receiving apparatus;

receiving, by the power receiving apparatus, the transmitted power and receiving the transmitted information on the power amount;

measuring, by the power receiving apparatus, a power amount of the power received in the specified period;

comparing, by the power receiving apparatus, the information on the power amount received by the power receiving apparatus and information on the power amount measured by the power receiving apparatus and determining whether the two power amounts match; and stopping, by the power receiving apparatus when it has been determined that the two power amounts do not match, reception of the power and reception of the information.

9. A power transmission control method comprising:

receiving power transmitted from a power transmitting unit of a power transmitting apparatus and receiving information on a power amount transmitted from the power transmitting unit, the power transmitting apparatus including a power generating unit generating the power using renewable energy, a first power measuring unit measuring the power amount of the power generated by the power generating unit in a specified period, and the power transmitting unit transmitting the power generated by the power generating unit in the specified period and the information on the power amount measured by the first power measuring unit to a power receiving apparatus;

measuring, by the power receiving apparatus, a power amount of the power received in the specified period;

comparing the information on the received power amount and information on the power amount measured by the power receiving apparatus, and determining whether the two power amounts match; and stopping, when it has been determined that the two power amounts do not match, reception of the power and reception of the information from the power transmitting apparatus.

* * * * *